US012700361B2

(12) United States Patent
Youn

(10) Patent No.: US 12,700,361 B2
(45) Date of Patent: Aug. 4, 2026

(54) DISPLAY DEVICE

(71) Applicant: LG Display Co., Ltd., Seoul (KR)

(72) Inventor: Chang Hee Youn, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/980,131

(22) Filed: Dec. 13, 2024

(65) Prior Publication Data

US 2025/0246142 A1 Jul. 31, 2025

(30) Foreign Application Priority Data

Jan. 29, 2024 (KR) ......................... 10-2024-0013472

(51) Int. Cl.
*G09G 3/3233* (2016.01)
*H10K 59/131* (2023.01)

(52) U.S. Cl.
CPC ... *G09G 3/3233* (2013.01); *G09G 2300/0819* (2013.01); *G09G 2300/0852* (2013.01); *G09G 2300/0861* (2013.01); *G09G 2310/08* (2013.01); *H10K 59/131* (2023.02)

(58) Field of Classification Search
CPC ......... G09G 3/3233; G09G 2300/0819; G09G 2300/0852; G09G 2300/0861; G09G 2310/08; H10K 59/131
See application file for complete search history.

(56) References Cited

U.S. PATENT DOCUMENTS

| | | | | |
|---|---|---|---|---|
| 11,741,901 B1 * | 8/2023 | Zhou | ..................... | G09G 3/3258 |
| | | | | 345/204 |
| 2018/0330663 A1 * | 11/2018 | Yang | ..................... | G09G 3/3225 |
| 2019/0304361 A1 * | 10/2019 | Lu | ...................... | H10K 59/1216 |
| 2021/0375201 A1 * | 12/2021 | Park | ..................... | G09G 3/3233 |
| 2023/0169928 A1 | 6/2023 | Eun et al. | | |
| 2023/0196998 A1 | 6/2023 | Han | | |
| 2024/0212565 A1 * | 6/2024 | Kim | ..................... | G09G 3/3266 |

FOREIGN PATENT DOCUMENTS

| | | |
|---|---|---|
| KR | 10-2023-0082162 A | 6/2023 |
| KR | 10-2023-0092487 A | 6/2023 |

* cited by examiner

*Primary Examiner* — Kenneth B Lee, Jr.
(74) *Attorney, Agent, or Firm* — Morgan, Lewis & Bockius LLP

(57) ABSTRACT

A display device includes a light emitting element, a driving TFT including a first electrode, a second electrode connected to the light emitting element, and a gate electrode, wherein a voltage level of the gate electrode is determined according to a data voltage input to the first electrode while the gate electrode and the second electrode are connected in a non-emission period, the driving TFT being configured to receive a first high voltage through the first electrode to control a current applied to the light emitting element according to a voltage difference between the gate electrode and the first electrode while the gate electrode is disconnected from the second electrode in an emission period, and a voltage compensation circuit configured to reflect a difference between the first high voltage in the emission period and the first high voltage in the non-emission period in the gate electrode.

20 Claims, 15 Drawing Sheets

EM_OFF period

EM_ON period

DISPLAY DEVICE

This application claims the benefit of and priority to Korean Patent Application No. 10-2024-0013472, filed on Jan. 29, 2024, which is hereby incorporated by reference as if fully set forth herein.

BACKGROUND

Field

The present disclosure relates to a display device.

Discussion of the Related Art

Organic light emitting display devices, which have recently been in the spotlight as display devices, have the advantages of high response speed, high contrast ratio, high luminous efficacy, high luminance, and wide viewing angle by using organic light emitting diodes (OLEDs) that emit light.

An organic light emitting display device includes subpixels which have OLEDs and driving transistors for driving the OLEDs and are arranged in a matrix form, and can display images by controlling the brightness of each subpixel according to the grayscale of image data. The brightness of each subpixel can be controlled by controlling the amount of current flowing through the OLED using the driving transistor.

Since the image quality of such an organic light emitting display device is greatly affected by the current driving capability of the subpixels, efforts are required to improve the accuracy and stability of the operation of the driving transistors.

SUMMARY

Accordingly, the present disclosure is directed to a display device that substantially obviates one or more problems due to limitations and disadvantages of the related art.

An object of the present disclosure is to provide a display device capable of improving the accuracy and stability of the operation of driving transistors of subpixels.

Additional advantages, objects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, a display device includes a light emitting element, a first high voltage source configured to supply a first high voltage, a driving TFT including a first electrode, a second electrode connected to the light emitting element, and a gate electrode, wherein a voltage level of the gate electrode is determined according to a data voltage input to the first electrode in a state in which the gate electrode and the second electrode are connected in a non-emission period, the driving TFT being configured to receive the first high voltage through the first electrode to control a current applied to the light emitting element according to a voltage difference between the gate electrode and the first electrode in a state in which the gate electrode is disconnected from the second electrode in an emission period, and a voltage compensation circuit configured to reflect a difference between the first high voltage in the emission period and the first high voltage in the non-emission period in the gate electrode.

The display device may further include a first emission control TFT configured to be turned on during the emission period to connect the first electrode and the first high voltage source, and a second emission control TFT configured to be turned on during the emission period to connect the second electrode and the light emitting element.

The display device may further include a first switching TFT configured to be turned on during the emission period to connect the gate electrode and the second electrode, a second switching TFT configured to be turned on during the non-emission period to connect an input line through which the data voltage is supplied to the first electrode, a third switching TFT configured to be turned on during the non-emission period to apply an initialization voltage to the gate electrode, and a fourth switching TFT configured to apply a reset voltage to a current input terminal of the light emitting element.

The display device may further include a first capacitor connected between the first high voltage source and the gate electrode.

The voltage compensation circuit may include a second high voltage source configured to supply a second high voltage at the same level as the first high voltage, a second capacitor connected to the gate electrode, a fifth switching TFT configured to connect the second capacitor and the first high voltage source during the emission period, and a sixth switching TFT configured to connect the second capacitor and the second high voltage source during the non-emission period.

The display device may further include a first capacitor connected between the first high voltage source and the gate electrode, wherein the second capacitor connected to the second high voltage source and the first capacitor connected to the first high voltage source are connected in parallel during the non-emission period, and the second capacitor connected to the first high voltage source and the first capacitor connected to the first high voltage source are connected in parallel during the emission period.

The second capacitor may reflect, in the gate electrode, a difference between the voltage of the second high voltage source connected to the second capacitor during the non-emission period and the voltage of the first high voltage source connected to the second capacitor during the emission period.

The display device may further include a first emission control TFT configured to be turned on during the emission period to connect the first electrode and the first high voltage source, and a second emission control TFT configured to be turned on during the light emission period to connect the second electrode and the light emitting element, wherein the fifth switching TFT may be configured to connect the second capacitor and the first high voltage source by receiving an on-level emission signal input to the first emission control TFT and the second emission control TFT, and the sixth switching TFT may be configured to connect the second capacitor and the second high voltage source by receiving an off-level emission signal input to the first emission control TFT and the second emission control TFT.

The display device may further include a seventh switching TFT configured to be turned on during the non-emission period to apply an on-bias stress (OBS) voltage to the first electrode.

In another aspect of the present disclosure, a display device includes a light emitting element, a first high voltage source configured to supply a first high voltage, a second high voltage source configured to supply a second high voltage, a driving TFT including a first electrode connected to a first node, a second electrode connected to a third node, and a gate electrode connected to a second node, a first emission control TFT configured to be turned on by an on-level emission signal to connect the first high voltage source and the first node, a second emission control TFT configured to be turned on by the on-level emission signal to connect the third node and the light emitting element, a first switching TFT configured to be turned on by an on-level first scan signal to connect the gate electrode and the second electrode, a second switching TFT configured to be turned on by an on-level second scan signal to connect an input line through which a data voltage is supplied to the first node, a fifth switching TFT configured to be turned on by the on-level emission signal to connect the first high voltage source and the second node, a sixth switching TFT configured to be turned on by an off-level emission signal to connect the second high voltage source and the second node, and a second capacitor having a first electrode connected to the second node and a second electrode connected to the fifth or sixth switching TFT.

The display device may further include a first capacitor having a first electrode connected to the second node and a second electrode connected to the first high voltage source.

The display device may further include a third switching TFT configured to be turned on by an on-level third scan signal to apply an initialization voltage to the second node, and a fourth switching TFT configured to be turned on by an on-level fourth scan signal to apply a reset voltage to a current input terminal of the light emitting element.

The display device may further include a seventh switching TFT configured to be turned on by the on-level fourth scan signal to apply an on-bias stress (OBS) voltage to the first electrode.

It is to be understood that both the foregoing general description and the following detailed description of the present disclosure are by way of example and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this application, illustrate aspect(s) of the present disclosure and together with the description serve to explain the principles of the present disclosure. In the drawings.

DETAILED DESCRIPTION

Figure 1:
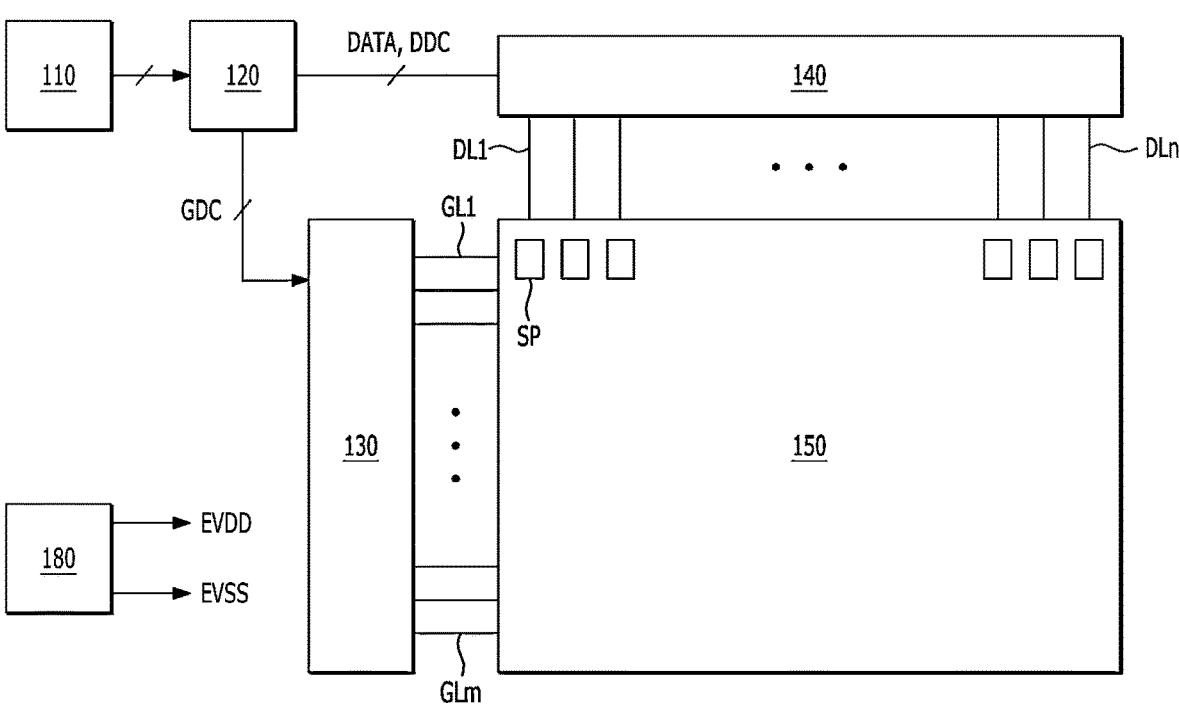
FIG. 1 is a schematic block diagram of an example display device.

The advantages and features of the present disclosure and the way of attaining the same will become apparent with reference to aspects described below in detail in conjunction with the accompanying drawings. The present disclosure, however, is not limited to the aspects disclosed hereinafter and may be embodied in many different forms. Rather, these example aspects are provided so that this disclosure will be through and complete and will fully convey the scope to those skilled in the art.

The shapes, sizes, ratios, angles, numbers, and the like, which are illustrated in the drawings in order to describe various aspects of the present disclosure, are merely given by way of example, and therefore, the present disclosure is not limited to the illustrations in the drawings. In the present disclosure, where the terms "comprise", "include", and the like are used, other elements may be added unless a more limiting term like "only" is used. The singular forms are intended to include the plural forms as well, and vice versa, unless the context clearly indicates otherwise.

In interpretation of a component, the component should be interpreted as including an error range unless otherwise explicitly described.

In describing positional relationships, for example, where the positional relationship between two parts is described using "on", "above", "below", "beside", or the like, one or more other parts may be located between the two parts unless a more limiting term like "directly" or "closely" is used.

In the description of the various aspects of the present disclosure, although terms such as, for example, "first" and "second," may be used to describe various elements, these terms are merely used to refer to the same or similar elements separately from each other. Therefore, in the present disclosure, an element modified by "first" may be the same as an element modified by "second," and vice versa, within the technical scope of the present disclosure unless otherwise mentioned.

In addition, a pixel circuit of a display device which will be described below may include a plurality of transistors. Transistors may be implemented as oxide thin film transistor (TFTs) containing an oxide semiconductor, low temperature polysilicon (LTPS) TFTs containing LTPS, and the like. Each transistor may be implemented as a p-channel TFT or an n-channel TFT.

A transistor is a three-electrode device including a gate, a source, and a drain. The source is an electrode that supplies carriers to the transistor. Within the transistor, carriers flow from the source. The drain is the electrode through which carriers exit the transistor. In a transistor, carriers flow from the source to the drain. In the case of an n-channel transistor, carriers are electrons, and thus the source voltage is lower than the drain voltage such that electrons can flow from the source to the drain. In an n-channel transistor, current flows from the drain to the source. In the case of a p-channel transistor (PMOS), carriers are holes, and thus the source voltage is higher than the drain voltage such that holes can flow from the source to the drain. In a p-channel transistor, current flows from the source to the drain because holes flow from the source to the drain. It should be noted that the source and the drain of a transistor are not fixed. For example, the source and the drain may change depending on the applied voltage. Therefore, the present disclosure is not limited by the source and the drain of a transistor. In the following description, the source and the drain of a transistor will be referred to as first and second electrodes.

A gate signal swings between a gate-on voltage and a gate-off voltage. The gate-on voltage is set to a voltage higher than a threshold voltage of the transistor, and the gate-off voltage is set to a voltage lower than the threshold voltage of the transistor. A transistor is turned on in response to the gate-on voltage and turned off in response to the gate-off voltage. For an n-channel transistor, the gate-on voltage may be a gate high voltage VGH, and the gate-off voltage may be a gate low voltage VGL. For a p-channel transistor, the gate-on voltage may be the gate low voltage VGL, and the gate-off voltage may be the gate high voltage VGH.

Each pixel of an electroluminescent display device includes a light emitting element and a driving element that generates a pixel current according to a voltage between a gate and a source to drive the light emitting element. The light emitting element includes an anode, a cathode, and an organic compound layer formed between the anode and the cathode. The organic compound layer may include a hole injection layer (HIL), a hole transport layer (HTL), an emission layer (EML), an electron transport layer (ETL), an electron injection layer (EIL), etc., but are not limited thereto. When a pixel current flows through the light emitting element, holes that have passed through the hole transport layer (HTL) and electrons that have passed through the electron transport layer (ETL) move to the emission layer (EML), forming excitons, and as a result, the emission layer (EML) emits visible light.

Recently, there has been an increasing number of attempts to implement some transistors included in a pixel circuit of electroluminescent display devices as oxide transistors. For oxide transistors, an oxide, that is, IGZO which is a compound of indium (In), gallium (Ga), zinc (Zn), and oxygen (O), is used instead of polysilicon as a semiconductor material.

Since oxide transistors have a low off-current, the oxide transistors have the advantages of high driving stability and reliability during a low-speed operation in which a transistor off period is relatively long. Therefore, oxide transistors can be used in large liquid crystal displays that require high-resolution and low-power operation, or in OLED TVs that cannot achieve the screen size using a low-temperature polysilicon process.

A display device according to the present aspect may be implemented as a television, a video player, a personal computer (PC), a home theater, an automobile electric device, a smartphone, etc., without being limited thereto. The display device according to the aspects of the present disclosure may be implemented as a light emitting display (LED) device, a quantum dot display (QDD) device, a liquid crystal display (LCD) device, etc. However, for convenience of description, an example of a display device that directly emits light based on inorganic light-emitting diodes or organic light-emitting diodes will be described below.

Like reference numerals refer to substantially like elements throughout the specification, unless otherwise specified. Hereinafter, aspects of the present disclosure will be described in detail with reference to the attached drawings. In the following description, where detailed description of a known function or configuration related to the present disclosure may unnecessarily obscure the subject matter of the present disclosure, the detailed description of such known function or configuration may be omitted.

FIG. 1 is a block diagram schematically showing a configuration of a display device.

Referring to FIG. 1, the display device may include an image provider 10, a timing controller 120, a scan driver 130, a data driver 140, a display panel 150, and a power supply 180.

The image provider 110 may output various driving signals in addition to image data signals supplied from the outside or image data signals stored in an internal memory. The image provider 110 may supply data signals and various driving signals to the timing controller 120.

The timing controller 120 may output a gate timing control signal GDC for controlling an operation timing of the scan driver 130, a data timing control signal DDC for controlling an operation timing of the data driver 140, and various synchronization signals including a vertical synchronization signal and a horizontal synchronization signal. The timing controller 120 may supply a data signal DATA supplied from the image provider 110 along with the data timing control signal DDC to the data driver 140. The timing controller 120 may be formed in the form of an integrated circuit (IC) and mounted on a printed circuit board, but is not limited thereto.

The data driver 140 may convert the data signal DATA in a digital form into an analog data voltage in response to the data timing control signal DDC supplied from the timing controller 120, and output the analog data voltage. The data driver 140 may supply the data voltage to the subpixels included in the display panel 150 through the data lines DL1 to DLn. The data driver 140 may be formed in the form of an IC and mounted on the display panel 150 or on a printed circuit board, but is not limited thereto.

The scan driver 130 may output a scan signal and an emission signal in response to the gate timing control signal GDC supplied from the timing controller 120. The scan driver 130 may supply at least one scan signal and an emission signal to the subpixels included in the display panel 150 through the gate lines GL1 to GLm. The scan driver 130 may be formed in the form of an IC or directly formed on the display panel 150 in a gate-in-panel structure.

The power supply 180 may convert power supplied from the outside into power required to drive the display device under the control of the timing controller 120 and output the converted power. For example, the power supply 180 may convert power supplied from the outside into a high voltage EVDD and a low voltage EVSS, output the voltages, and generate and output voltages required to drive the scan driver 130 or voltages required to drive the data driver 140.

In the display panel 150, a plurality of data lines DL1 to DLn extending in the column direction (or vertical direction) and a plurality of gate lines GL1 to GLm extending in the row direction (or horizontal direction) intersect, and subpixels SP are arranged in a matrix form at the intersections to form a pixel array. Each subpixel SP includes a light emitting element and a pixel circuit that controls the amount of current applied to the anode of the light emitting element.

The pixel circuit may include a driving TFT DT that controls the amount of current such that a constant current flows through the light emitting element. The light emitting element emits light during an emission period and does not emit light during periods other than the emission period. During periods other than the emission period, initialization of the pixel circuit, programming, and reset of the light emitting element may be performed.

Figure 2:
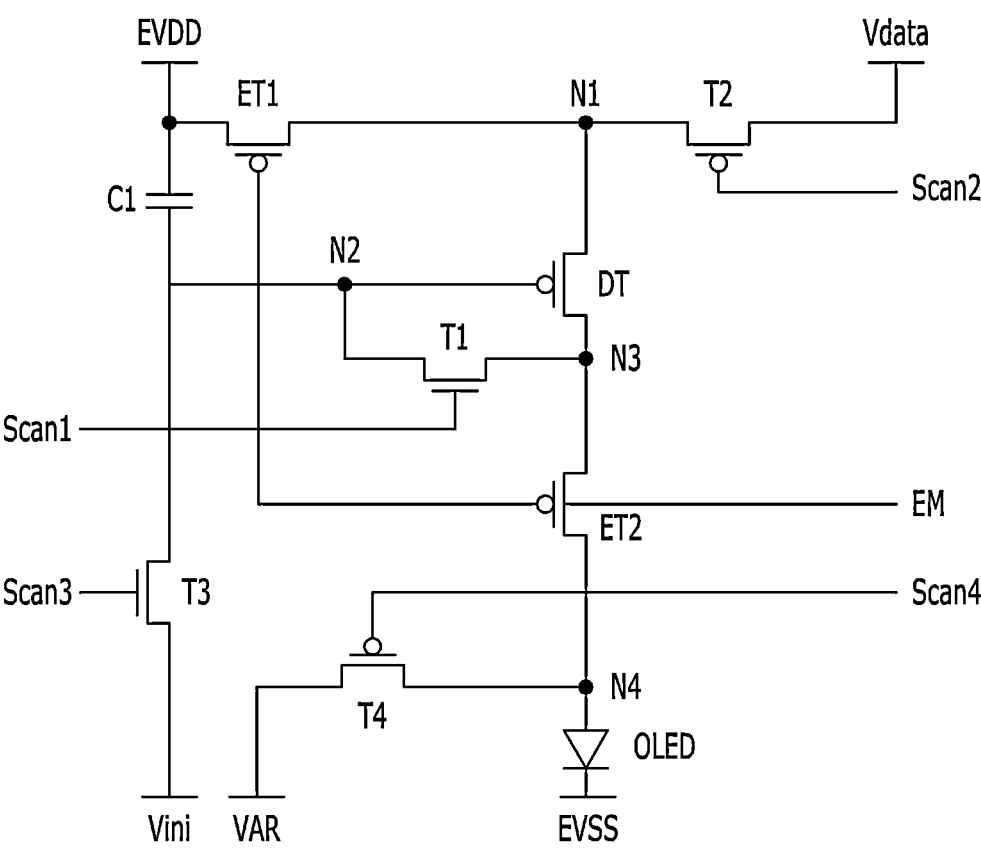
FIG. 2 is an equivalent circuit diagram of one example subpixel included in the light emitting display device of FIG. 1.
Figure 3:
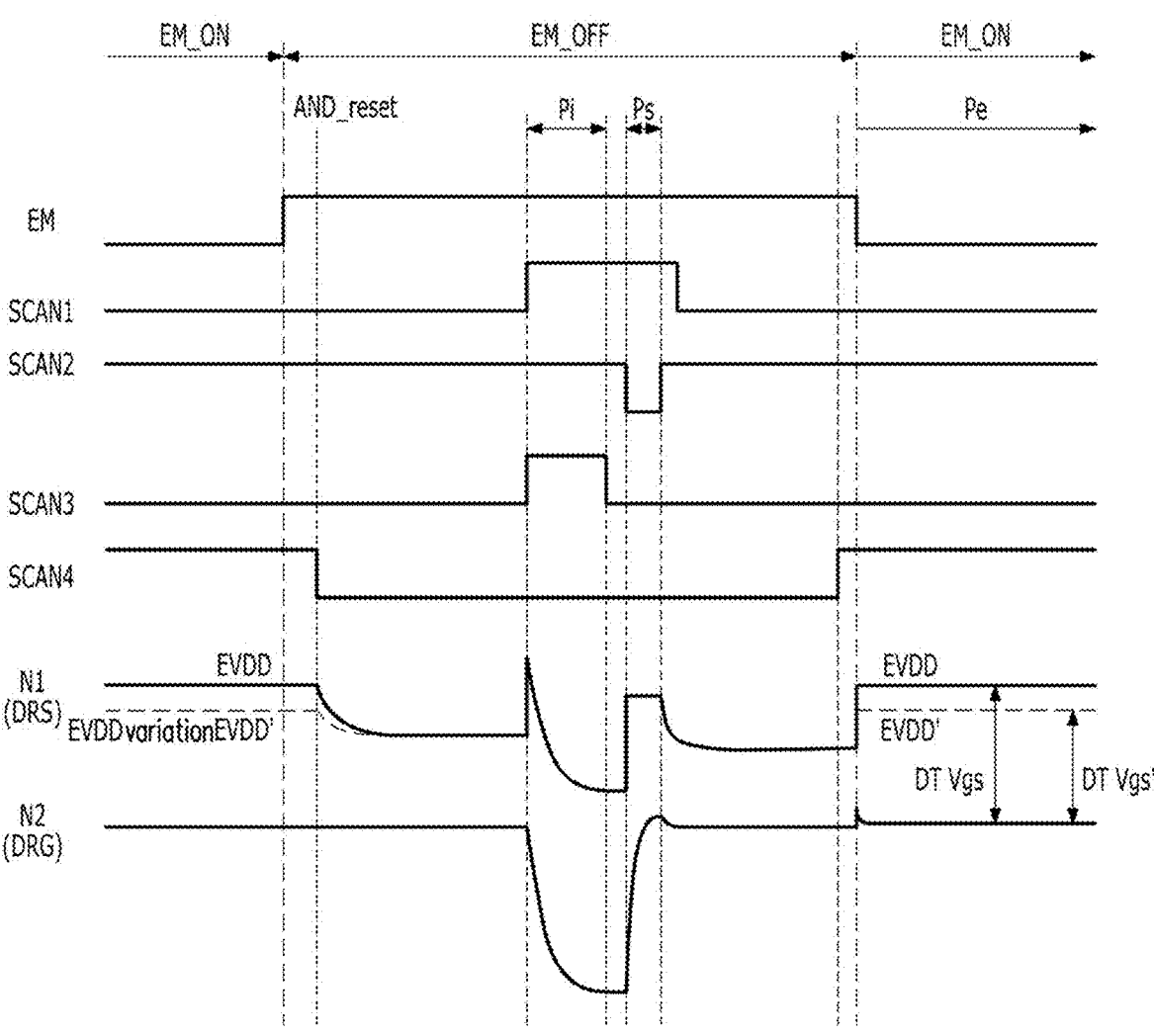
FIG. 3 is a diagram illustrating driving waveforms of the example subpixel of FIG. 2.

FIG. 2 is a schematic configuration diagram of an example subpixel SP included in the example display device of FIG. 1, and FIG. 3 is a diagram illustrating driving waveforms of the example subpixel SP of FIG. 2. In the following description, a first electrode of a transistor may be one of a source electrode and a drain electrode, and a second electrode of the transistor may be the other one of the source electrode and the drain electrode.

One subpixel SP may be supplied with a high voltage EVDD, a low voltage EVSS, an initialization voltage Vini, and an anode reset voltage VAR, and receive first to fourth scan signals Scan1 to Scan4 (or SCAN1 to SCAN4), an emission signal EM, and a data voltage signal Vdata.

One subpixel SP includes an organic light emitting diode (OLED), a driving TFT DT, a capacitor C1, a first emission control TFT ET1, a second emission control TFT ET2, and first to fourth switching TFTs T1 to T4. Each TFT of the subpixel SP may be configured as a p-type MOSFET (PMOS) or an n-type MOSFET (NMOS). For example, the driving TFT DT, the first emission control TFT ET1, the second emission control TFT ET2, the second switching TFT T2, and the fourth switching TFT T4 may be implemented as p-type MOSFETs, and the first switching TFT T1 and the third switching TFT T3 may be implemented as n-type MOSFETs, without being limited thereto.

The OLED emits light by a driving current supplied from the driving TFT DT. The anode of the OLED is connected to a fourth node N4, and the cathode of the OLED is connected to a line through which the low voltage EVSS is supplied.

The gate electrode of the driving TFT DT may be connected to a second node N2, the first electrode thereof may be connected to a first node N1, and the second electrode thereof may be connected to a third node N3. The driving TFT DT may generate a driving current in response to the data voltage signal Vdata. The driving TFT DT may be a p-type MOSFET (PMOS) and may be implemented as a low-temperature polycrystalline silicon (LTPS) thin film transistor.

The first emission control TFT ET1 and the second emission control TFT ET2 control emission of the OLED. The first emission control TFT ET1 and the second emission control TFT ET2 are simultaneously turned on/off by the emission signal EM simultaneously input to the gate electrodes thereof. The first emission control TFT ET1 may have a first electrode to which the high voltage EVDD is applied and a second electrode connected to the first node N1. The first emission control TFT ET1 may serve to transmit the high voltage EVDD to the first electrode of the driving TFT DT in response to the emission signal EM. The second emission control TFT ET2 may have a first electrode connected to the third node N3 and a second electrode connected to the fourth node N4. The second emission control TFT ET2 may serve to transmit the driving current to the anode of the OLED in response to the emission signal EM. The first emission control TFT ET1 and the second emission control TFT ET2 may be p-type MOSFETs (PMOSs) and may be implemented as low-temperature polycrystalline silicon (LTPS) thin film transistors.

The storage capacitor C1 maintains the data voltage Vdata stored in the subpixel SP for one frame. One electrode of the storage capacitor C1 is connected to the second node N2 to which the gate electrode of the driving TFT DT is connected, and the other electrode thereof is provided with the high voltage EVDD.

The first switching TFT T1 connects the gate electrode and the drain electrode, which is the second electrode, of the driving TFT DT to diode-connect the driving TFT DT. The first switching TFT T1 may include a gate electrode connected to the input line through which the first scan signal SCAN1 (or Scan1) is applied, a first electrode connected to the third node N3, and a second electrode connected to the second node N2. The first switching TFT T1 may be an n-type MOSFET (NMOS) and may be implemented as an oxide thin film transistor in order to minimize leakage current during a turn-off period. Accordingly, the first switching TFT T1 diode-connects the gate electrode and drain electrode of the driving TFT DT in response to the first scan signal Scan1 at a high level, which is a turn-on voltage.

The second switching TFT T2 applies the data voltage signal Vdata to the first node N1, which is the first electrode of the driving TFT DT. The second switching TFT T2 may include a gate electrode connected to the input line through which the second scan signal SCAN2 (or Scan2) is applied, a first electrode connected to the data line through which the data voltage signal Vdata is supplied, and a second electrode connected to the first node N1. The second switching TFT T2 may be a p-type MOSFET (PMOS) and may be implemented as a low-temperature polycrystalline silicon (LTPS) thin film transistor. Accordingly, the second switching TFT T2 applies the data voltage signal Vdata supplied from the data line to the first node N1 corresponding to the first electrode of the driving TFT DT in response to the second scan signal Scan2 at a low level, which is a turn-on voltage.

The third switching TFT T3 applies the initialization voltage Vini to the second node N2, which is the gate electrode of the driving TFT DT. The third switching TFT T3 may include a gate electrode connected to the input line through which the third scan signal SCAN3 (or Scan3) is applied, a first electrode to which the initialization voltage Vini is applied, and a second electrode connected to the second node N2. The third switching TFT T3 may be an n-type MOSFET (NMOS) and may be implemented as an oxide thin film transistor in order to minimize leakage current. Accordingly, the third switching TFT T3 applies the initialization voltage Vini to the second node N2 corresponding to the gate electrode of the driving TFT DT in response to the third scan signal Scan3 at a high level, which is the turn-on voltage.

The fourth switching TFT T4 applies the anode reset voltage VAR to the anode of the OLED. The fourth switching TFT T4 may include a gate electrode connected to the input line through which the fourth scan signal SCAN4 (or Scan4) is applied, a first electrode to which the anode reset voltage VAR is applied, and a second electrode connected to the fourth node N4. The fourth switching TFT T4 may be a p-type MOSFET (PMOS) and may be implemented as a low-temperature polycrystalline silicon (LTPS) thin film transistor. Accordingly, the fourth switching TFT T4 applies the anode reset voltage VAR to the anode of the OLED in response to the fourth scan signal Scan4 at a low level, which is the turn-on voltage.

The driving period of the subpixel SP having this configuration may include an emission period EM_ON in which the emission signal EM is applied at an on level and a non-emission period EM_OFF in which the emission signal EM is applied at an off level. Here, the non-emission period EM_OFF includes an initial period Pi and a sampling period Ps, and a data voltage Vdata may be written to the subpixel SP in the non-emission period EM_OFF.

When the non-emitting period EM_OFF begins, the fourth switching TFT T4 applies the anode reset voltage VAR to the anode of the OLED until immediately before the emission period EM_ON begins in response to the low-level fourth scan signal Scan4 which is the turn-on voltage.

During the initial period Pi and the sampling period Ps, the first scan signal Scan1 is applied at a high level, which is the turn-on voltage. The first switching TFT T1 connects the second node N2 and the third node N3 during the initial period Pi and the sampling period Ps in response to the high-level first scan signal Scan1, which is the turn-on voltage. Accordingly, the driving TFT DT enters a diode connecting state in which the gate electrode and the drain electrode are short-circuited and operates as a diode.

During the initial period Pi, the third scan signal Scan3 is applied at a high level, which is the turn-on voltage. The third switching TFT T3 is turned on by the turn-on voltage of the third scan signal Scan3 to apply the initialization voltage $Vini$ to the second node N2. Since the second node N2 and the third node N3 are connected to each other, the second node N2 corresponding to the gate electrode of the driving TFT DT and the third node N3 corresponding to the drain electrode of the driving TFT DT are initialized to the initialization voltage $Vini$. The initialization voltage $Vini$ may be selected within a voltage range sufficiently lower than the operating voltage of the OLED and may be set to a voltage equal to or lower than the low voltage EVSS.

Figure 4:
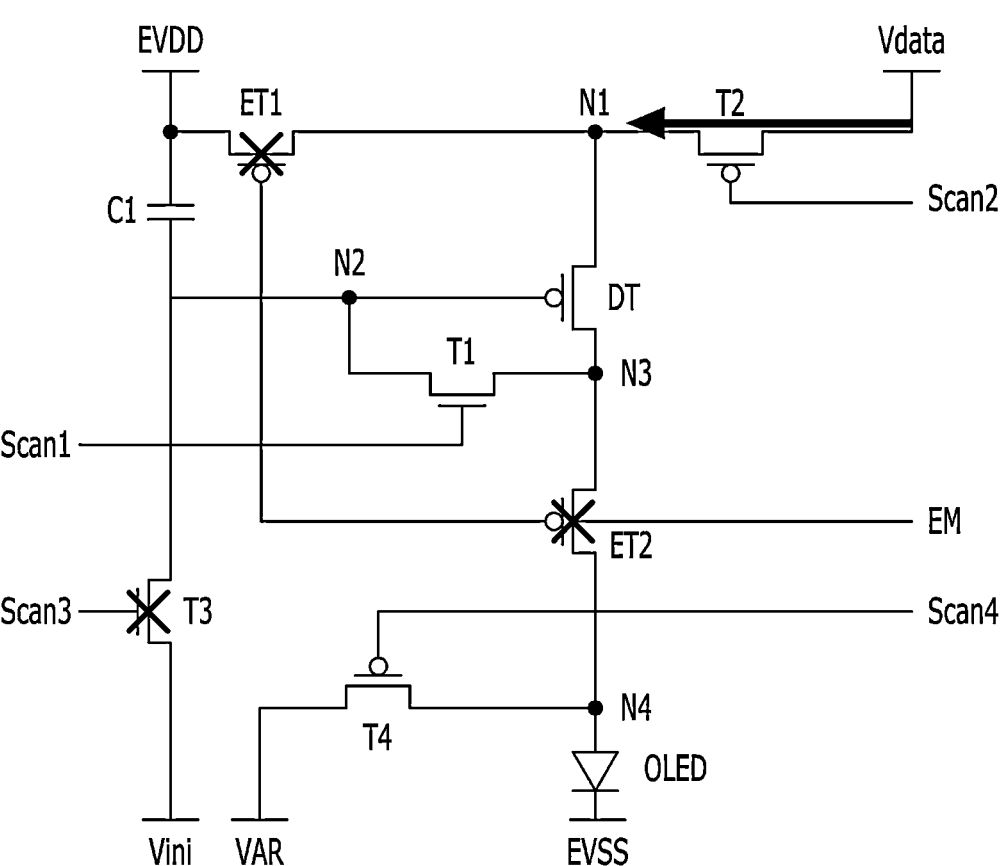
FIGS. 4 and 5 are diagrams for describing variation in a gate-source voltage Vgs that may occur in the example subpixel of FIG. 2.

The sampling period Ps is a period in which the threshold voltage Vth of the driving TFT DT is sampled and the data voltage Vdata is programmed. FIG. 4 is a diagram illustrating a method of operating the example subpixel SP during the sampling period Ps.

As shown in FIGS. 3 and 4, the second scan signal Scan2 is applied at a low level, which is the turn-on voltage, during the sampling period Ps. The second switching TFT T2 applies the data voltage signal Vdata applied from the data line to the first node N1 corresponding to the first electrode of the driving TFT DT in response to the low-level second scan signal Scan2, which is the turn-on voltage. During the sampling period Ps, the driving TFT DT is turned on and a current Ids flows between the source and the drain of the driving TFT DT. Since the gate electrode and drain electrode of the driving TFT DT are diode-connected, the voltage at the second node N2 rises until the gate-source voltage Vgs of the driving TFT DT reaches the threshold voltage Vth due to the current flowing from the source electrode to the drain electrode. During the sampling period Ps, the second node N2 is charged to a voltage Vdata−|Vth| corresponding to the difference between the data voltage Vdata and the threshold voltage Vth of the driving TFT DT. In this manner, the voltage at the second node N2 is determined by the data voltage Vdata and the threshold voltage Vth of the driving TFT DT regardless of the high voltage EVDD during the sampling period Ps.

Figure 5:
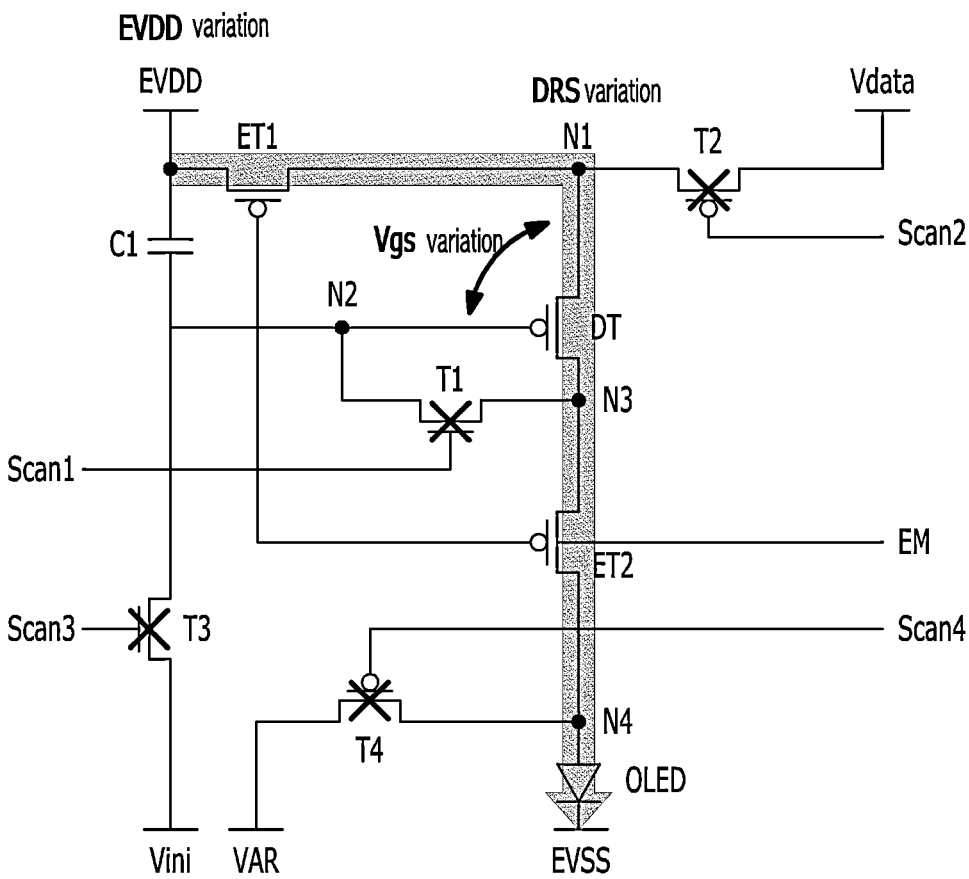

FIG. 5 is a diagram illustrating a method of operating the example subpixel SP during the emission period Pe.

As shown in FIGS. 3 and 5, when the emission signal EM is applied at a low level which is the turn-on voltage (EM_ON) during the emission period Pe, the first emission control TFT ET1 and the second emission control TFT ET2 are turned on. The high voltage EVDD is applied to the first node N1 as the first emission control TFT ET1 is turned on, and a current path is formed between the third node N3 and the fourth node N4 as the second emission control TFT ET2 is turned on. Accordingly, the driving current Ioled generated through the source and drain electrodes of the driving TFT DT can be applied to the OLED to emit light. In this manner, during the emission period Pe, the high voltage EVDD is applied to the first node N1 corresponding to the source electrode of the driving TFT DT, and thus the OLED emits light according to the data voltage Vdata programmed during the sampling period Ps.

However, the high voltage EVDD may fluctuate due to various causes such as IR drop. When the high voltage changes and thus is applied as EVDD', the voltage DRS of the source electrode of the driving TFT DT also changes, and as a result, the gate-source voltage Vgs of the driving TFT DT also changes to Vgs'. As a result, there is a problem that the subpixel SP emits light with a luminance different from an intended luminance. In order to solve the problem that the luminance changes due to a change in the gate-source voltage Vgs of the driving TFT DT caused by a change in the high voltage EVDD, a subpixel structure according to an aspect of the present disclosure is applicable.

A subpixel according to a first aspect of the present disclosure differs from the conventional subpixel shown in FIG. 2 in that the former further includes a voltage compensation circuit that reflects the difference between a first high voltage EVDD during a non-emission period in which a data voltage is sampled and a first high voltage EVDD during a period in which the first high voltage EVDD is applied to the source electrode of the driving TFT DT to cause light emission in the gate electrode of the driving TFT DT. That is, by reflecting a variation in the first high voltage EVDD applied to the source electrode of the driving TFT DT during the emission operation of the driving TFT DT in the gate electrode of the driving TFT DT using the voltage compensation circuit, the range of variation of the gate-source voltage Vgs of the driving TFT DT can be reduced.

Figure 6:
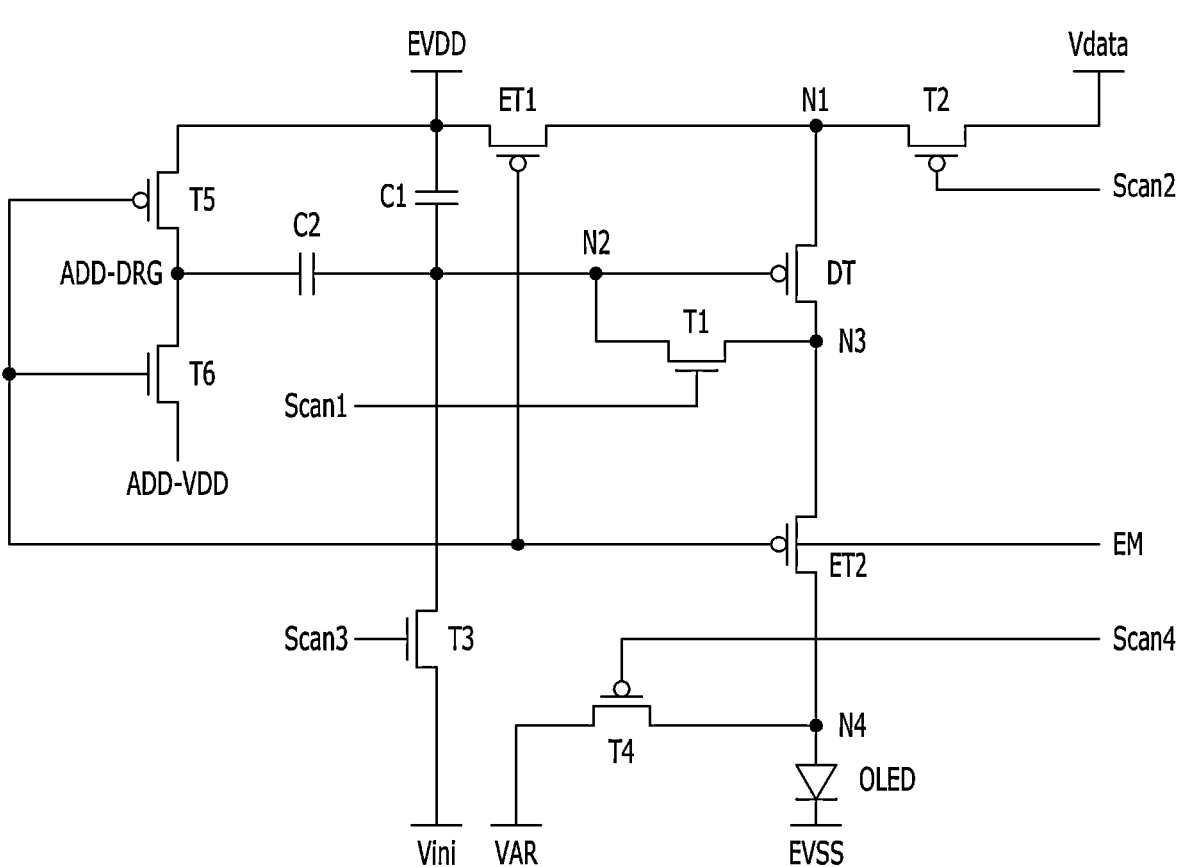
FIG. 6 is a circuit diagram of an example subpixel according to a first aspect of the present disclosure.
Figure 7:
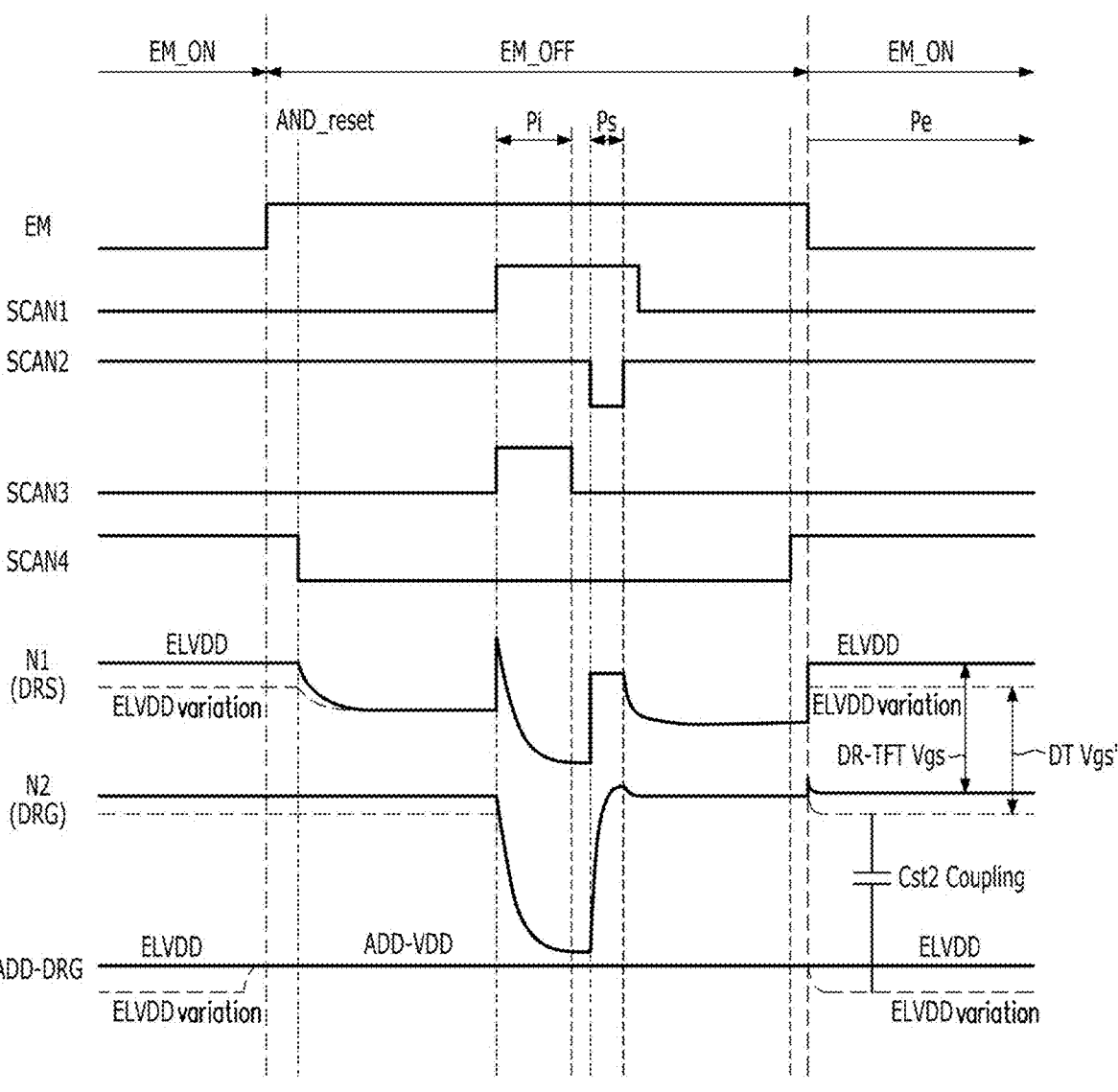
FIG. 7 is a driving waveform diagram of the example subpixel of FIG. 6.

FIG. 6 is a circuit diagram of an example subpixel according to the first aspect of the present disclosure, and FIG. 7 is a driving waveform diagram of the example subpixel of FIG. 6.

As shown in FIGS. 6 and 7, one subpixel SP may be provided with the first high voltage EVDD, a low voltage EVSS, an initialization voltage $Vini$, and an anode reset voltage VAR, may receive first to fourth scan signals Scan1 to Scan4 (or SCAN1 to SCAN4), an emission signal EM, and a data voltage signal Vdata, and may further receive a second high voltage ADD-VDD. The second high voltage ADD-VDD may be supplied independently from the first high voltage EVDD such that the second high voltage ADD-VDD is not affected by changes in the first high voltage EVDD. The second high voltage ADD-VDD may be supplied at the same level as the first high voltage EVDD.

One subpixel SP may include an OLED, a driving TFT DT, a first capacitor C1, a first emission control TFT ET1, a second emission control TFT ET2, and first to fourth switching TFTs T1 to T4, and the subpixel according to the first aspect of the present disclosure may further include fifth and sixth switching TFTs T5 and T6 and a second capacitor C2 in order to compensate for the gate voltage of the driving TFT DT according to a change in the first high voltage EVDD. Each TFT of the subpixel SP may be configured as a p-type MOSFET (PMOS) or an n-type MOSFET (NMOS). For example, the driving TFT DT, the first emission control TFT ET1, the second emission control TFT ET2, the second switching TFT T2, the fourth switching TFT T4, and the fifth switching TFT T5 may be implemented as p-type MOSFETs, and the first switching TFT T1, the third switching TFT T3, and the sixth switching TFT T6 may be implemented as an n-type MOSFETs, without being limited thereto.

The subpixel according to the first aspect of the present disclosure shown in FIG. 6 differs from the conventional subpixel shown in FIG. 2 with respect to the circuit configuration of the area of the second node N2 connected to the gate electrode of the driving TFT DT.

The subpixel according to the first aspect of the present disclosure may further include the second capacitor C2 connected to the second node N2, the fifth switching TFT T5 that allows the first high voltage EVDD to be applied to the second capacitor C2 when an on-level emission signal EM_ON is input, and the sixth switching TFT T6 that allows the second high voltage ADD-VDD to be applied to the second capacitor C2 when an off-level emission signal EM_OFF is input.

Although both the fifth and sixth switching TFTs T5 and T6 operate by receiving the emission signal EM, either one of the fifth and sixth switching TFTs T5 and T6 can be turned on according to the high/low level of the emission signal EM because the fifth and sixth switching TFTs T5 and T6 are different types of TFTs.

The gate electrode of the fifth switching TFT T5 receives the emission signal EM, the first electrode thereof is provided with the first high voltage EVDD, and the second electrode thereof is connected to the second capacitor C2. The fifth switching TFT T5 is turned on when the on-level emission signal EM_ON is input to allow the first high voltage EVDD to be applied to the second capacitor C2. Accordingly, the fifth switching TFT T5 may be implemented as the same p-type MOSFET (PMOS) as the first and second emission control TFTs ET1 and ET2.

The gate electrode of the sixth switching TFT T6 receives the emission signal EM, the first electrode is provided with the second high voltage ADD-VDD, and the second electrode is connected to the second capacitor C2. The sixth switching TFT T6 is turned on when the off-level emission signal EM_OFF is input to allow the second high voltage ADD-VDD to be applied to the second capacitor C2. Therefore, the sixth switching TFT T6 may be implemented as an n-type MOSFET (NMOS).

The first electrode of the second capacitor C2 is connected to the second node N2 to which the gate electrode of the driving TFT DT is connected, and the second electrode thereof is connected to a connection node between the fifth switching TFT T5 and the sixth switching TFT T6. The first high voltage EVDD or the second high voltage ADD-VDD may be applied to the second electrode of the second capacitor C2 depending on the on/off operations of the fifth switching TFT T5 and the sixth switching TFT T6. As a result, the difference between the first high voltage EVDD and the second high voltage ADD-VDD may be reflected in the second node N2 to which the first electrode of the second capacitor C2 is connected. The node to which the second electrode of the second capacitor C2 is connected, that is, the node to which the fifth switching TFT T5 or the sixth switching TFT T6 is connected, is referred to as an additional gate electrode node ADD-DRG.

During the non-emission period (EM_OFF period), the sixth switching TFT T6 is turned on and thus the second high voltage ADD-VDD can be applied to the second capacitor C2. Accordingly, the second high voltage ADD-VDD is reflected in the additional gate electrode node ADD-DRG. During the emission period (EM_ON period), the fifth switching TFT T5 is turned on and thus the first high voltage EVDD can be applied to the second capacitor C2. Accordingly, the first high voltage EVDD is reflected in the additional gate electrode node ADD-DRG. The first high voltage EVDD may change for various reasons such as IR drop, but the second high voltage ADD-VDD is not affected by changes in the first high voltage EVDD. Accordingly, when the first high voltage EVDD is applied during the emission period (EM_ON period) after a data voltage Vdata is sampled (the second high voltage ADD-VDD is applied) during the non-emission period (EM_OFF period), the voltage difference between the first high voltage EVDD and the second high voltage ADD-VDD may be reflected in the second node N2 to which the second capacitor C2 is connected.

Figure 8:
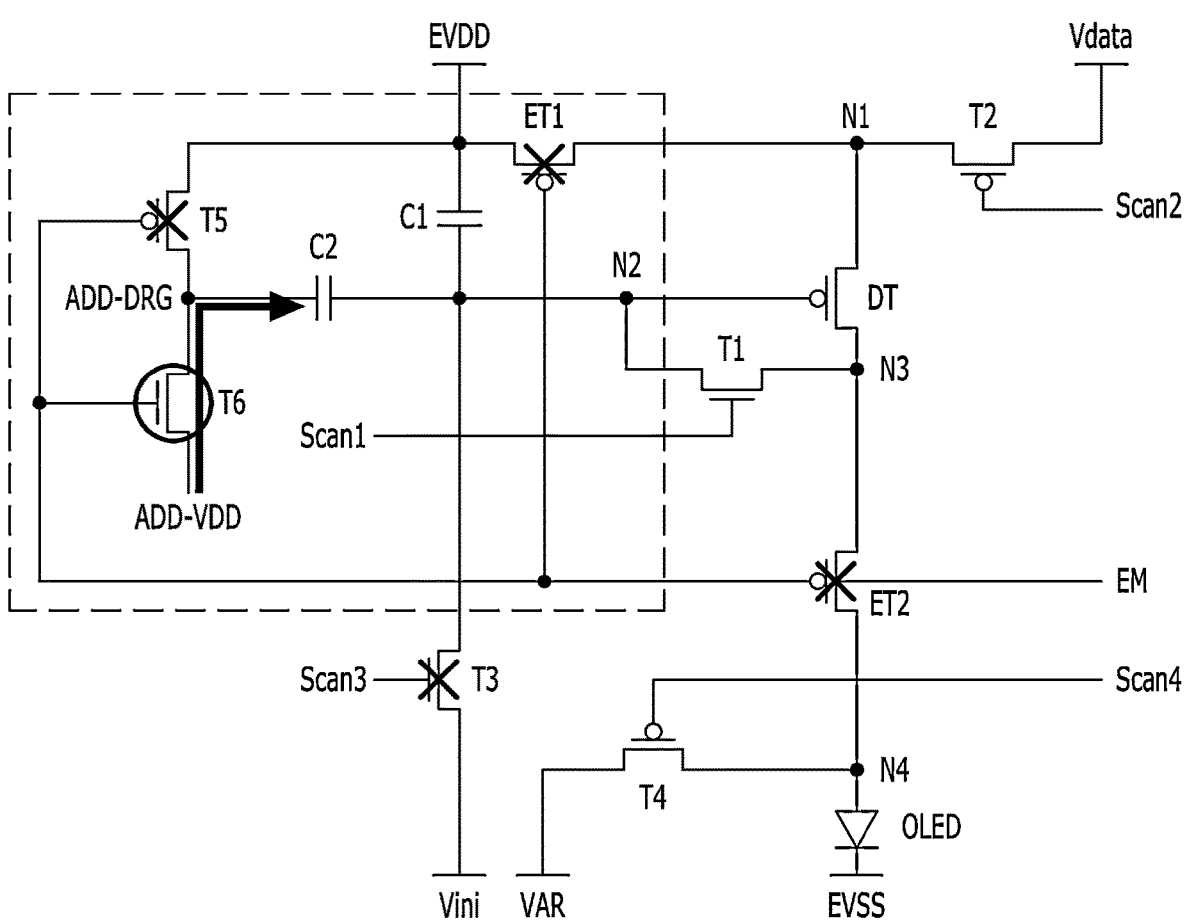
FIGS. 8 and 9 are diagrams for describing a method of driving the example subpixel of FIG. 6.

As shown in FIG. 8, during the non-emission period (EM_OFF period), the sixth switching TFT T6 is turned on and the fifth switching TFT T5 is turned off. Accordingly, the second high voltage ADD-VDD is applied to the second capacitor C2, and thus the additional gate electrode node ADD-DRG can be maintained at the second high voltage ADD-VDD. Here, the non-emission period EM_OFF includes the sampling period Ps. Therefore, while the voltage of the additional gate electrode node ADD-DRG is maintained at the second high voltage ADD-VDD, the second node N2 is charged to a voltage Vdata−|Vth| corresponding to the difference between the data voltage Vdata and the threshold voltage Vth of the driving TFT DT.

Figure 9:
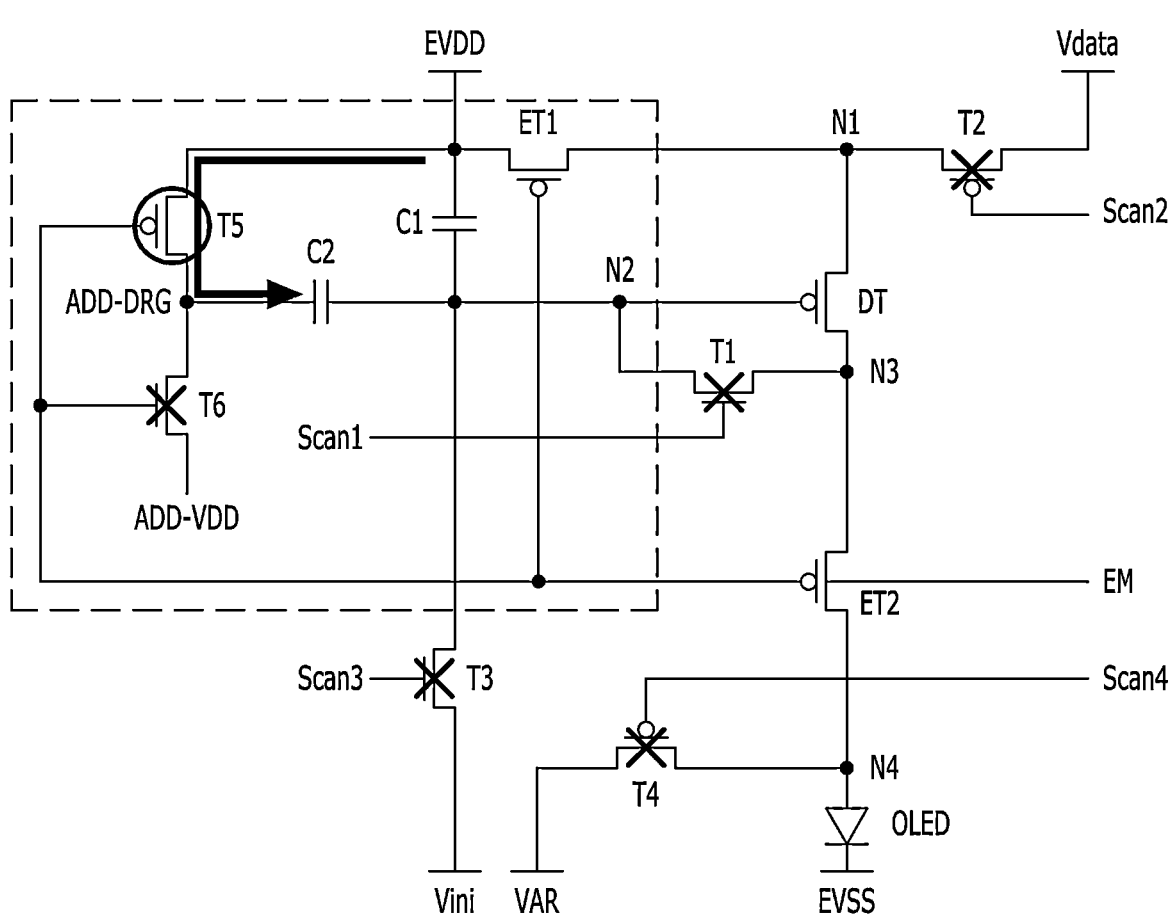

As shown in FIGS. 9 and 7, during the emission period (EM_ON period), the sixth switching TFT T6 is turned off and the fifth switching TFT T5 is turned on. Accordingly, the first high voltage EVDD is applied to the second capacitor C2, and thus the additional gate electrode node ADD-DRG can be maintained at the first high voltage EVDD. The second high voltage ADD-VDD is an independent voltage and is not affected by the first high voltage EVDD. Therefore, when the first high voltage EVDD changes during the emission period after the sampling period, the changed first high voltage is transmitted to the second node N2 according to capacitance coupling between the second capacitor C2 and the second node N2.

Accordingly, as shown in FIG. 7 illustrating voltage changes in the node N1 (the source node DRS of the driving TFT) and the node N2 (the gate node DRG of the driving TFT), the voltage of the second node N2 (the gate node DRG of the driving TFT) may also change by the variation in the voltage of the first node N1 (the source node DRS of the driving TFT) due to the variation in the first high voltage EVDD. As a result, the variation in gate-source voltage Vgs can be reduced.

Figure 10:
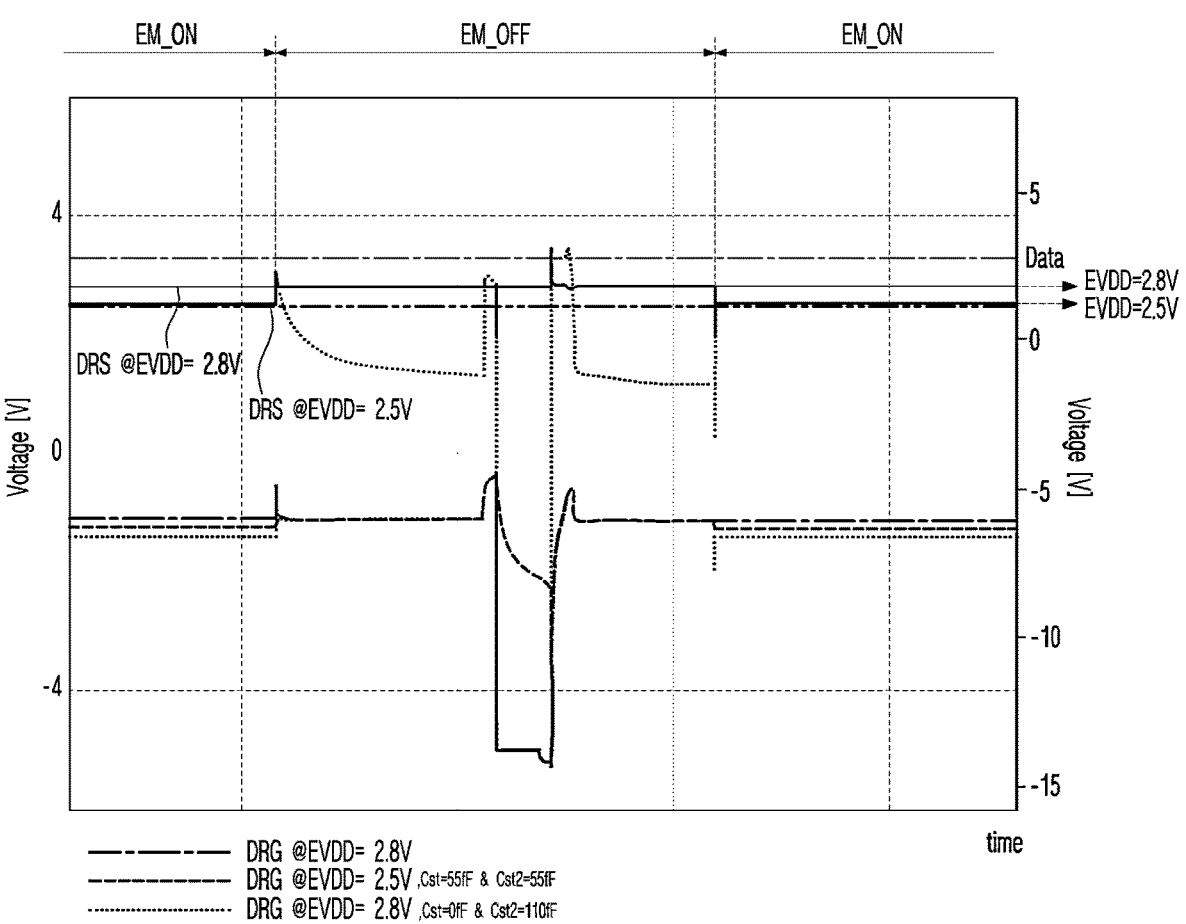
FIG. 10 is a diagram for describing characteristics of a capacitor of the example subpixel of FIG. 6.

FIG. 10 is a graph showing results of simulating the effect of compensation of the voltage of the second node N2 (the gate node DRG of the driving TFT) according to the capacitance ratio of the first capacitor C1 and the second capacitor C2, and shows measured voltages of the source node DRS and the gate node DRG of the driving TFT DT when the first high voltage EVDD is 2.8 V during sampling and has changed to 2.5 V during emission.

In theory, a compensation value of the gate node DRG of the driving TFT DT may satisfy the following expression.

$$DRG \text{ Node compensation} = \qquad \text{<Expression 1>}$$
$$\frac{Cst2}{Cst + Cst2} \times EVDD \text{ variation} [V]$$

As a result of the simulation, it can be ascertained that Vgs of the driving TFT DT has changed from 3.91 V to 3.90 V and thus a voltage difference of 10 mV has occurred when Cst of the first capacitor C1 is 0 [fF] and Cst2 of the second capacitor C2 is 110 [fF], as shown in the graph of FIG. 10.

It can be ascertained that Vgs of the driving TFT DT has changed from 3.89 V to 3.74 V and thus a voltage difference of 150 mV has occurred when Cst of the first capacitor C1 is 55 [fF] and Cst2 of the second capacitor C2 is 55 [fF].

Accordingly, it can be ascertained that the larger the capacitance of the second capacitor C2 is than the capacitance of the first capacitor C1, the more the effect of compensation of Vgs of the driving TFT DT is improved.

Meanwhile, when the second capacitor C2 is used as a storage capacitor instead of a voltage compensation capacitor, it is possible to eliminate the first capacitor C1. That is, the first capacitor C1 fixed to the first high voltage EVDD is eliminated, and the second capacitor C2 to which the second high voltage ADD-VDD is applied during the non-emission period (EM_OFF period) and the first high voltage EVDD is applied during the emission period (EM_ON period) may be used as a storage capacitor for sampling the data voltage Vdata.

In the case of operation using only the second capacitor C2 without the first capacitor C1, the data voltage Vdata of the second node N2 may be stored in the second capacitor C2 to which the second high voltage ADD-VDD is applied during the non-emission period (EM_OFF period). Thereafter, the first high voltage EVDD is applied to the second capacitor C2 during the emission period (EM_ON period), and thus the difference between the second high voltage ADD-VDD and the first high voltage EVDD can be reflected in the second node N2. Accordingly, the difference between the first high voltage EVDD and the second high voltage ADD-VDD can be reflected in the second node N2 while the voltage at the source node DRS changes due to variation in the first high voltage EVDD during the emission period (EM_ON period). That is, as the first high voltage EVDD changes, the voltages at the source node DRS and the gate node DRG of the driving TFT DT also change, and as a result, the gate-source voltage Vgs can be maintained.

Figure 11:
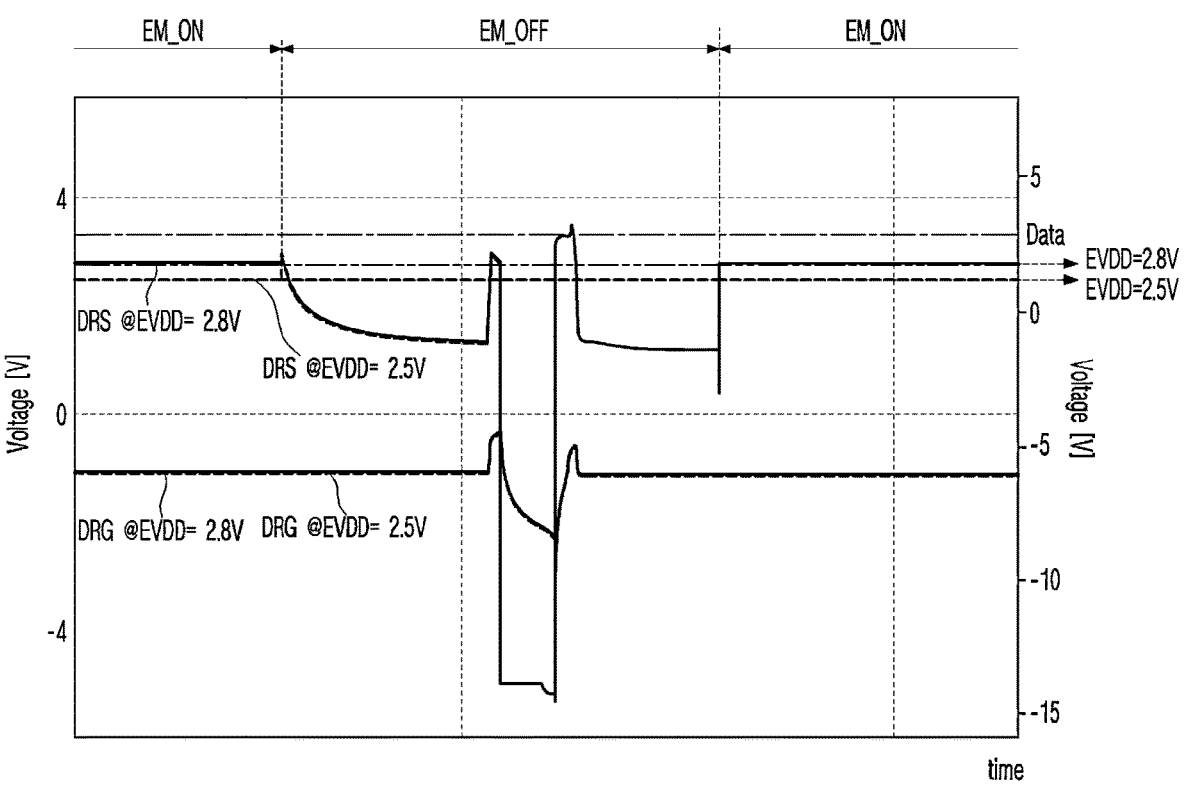
FIGS. 11 and 12 are graphs showing results of simulating variations in gate-source voltages Vgs of subpixels according to a comparative example and the first aspect.
Figure 12:
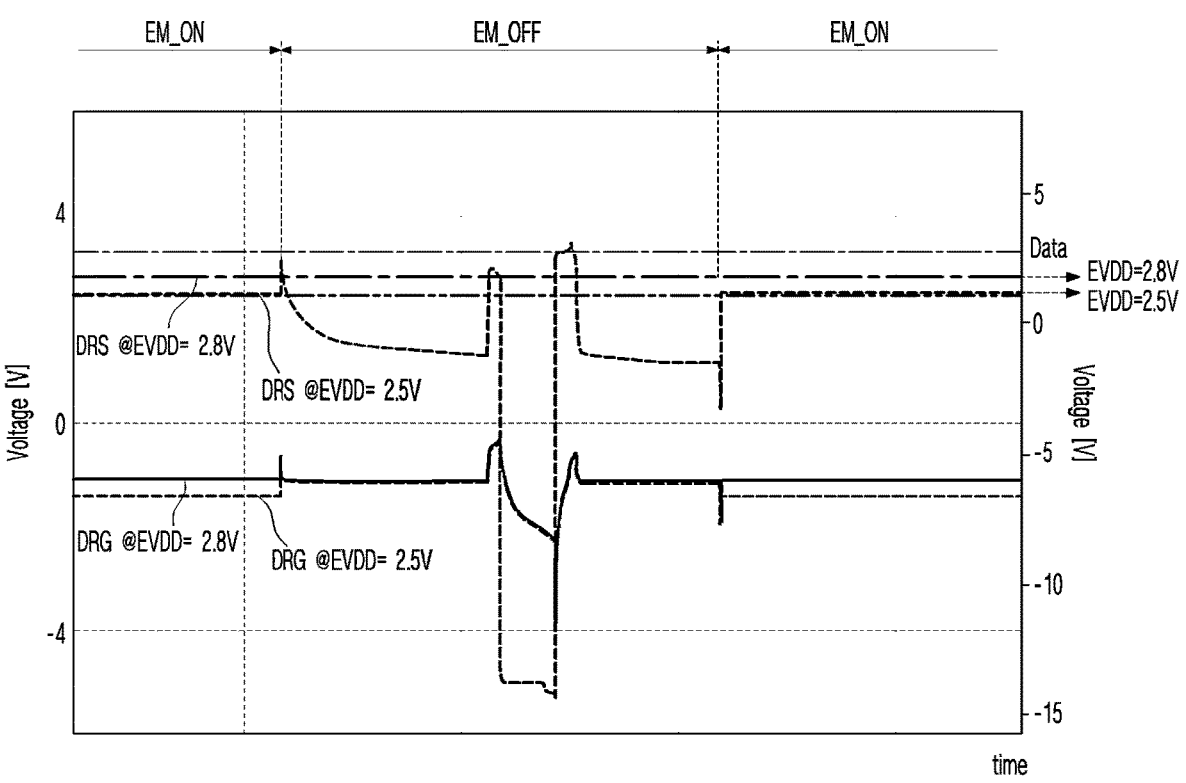

FIGS. 11 and 12 are graphs showing results of simulating variations in the gate-source voltage Vgs in a comparative example in which the conventional subpixel structure is applied and in an aspect in which the subpixel structure of the first aspect of the present disclosure is applied under the same conditions in which the first high voltage EVDD varies. FIG. 11 is a simulation graph of the comparative example and FIG. 12 is a simulation graph of the aspect.

From the simulation graph of the comparative example shown in FIG. 11, it can be ascertained that the voltages at the source node DRS and the gate node DRG of the driving TFT DT do not change during the sampling period even if the first high voltage EVDD changes from 2.8 V to 2.5 V. It can be ascertained that the voltage at the source node DRS changes according to variation in the first high voltage EVDD, whereas the voltage at the gate node DRG is not affected by the variation in the first high voltage EVDD during the emission period. Accordingly, it can be ascertained that the luminance will change because there is a difference between the gate-source voltage Vgs in the sampling period and the gate-source voltage Vgs in the emission period.

From the simulation graph of the aspect shown in FIG. 12, it can be ascertained that the voltages at the source node DRS and the gate node DRG of the driving TFT DT do not change during the sampling period even if the first high voltage EVDD changes from 2.8 V to 2.5 V. It can be ascertained that the voltage at the source node DRS changes according to variation in the first high voltage EVDD and the voltage at the gate node DRG also changes according to the variation in the first high voltage EVDD during the emission period. That is, as the first high voltage EVDD changes, the voltage at the source node DRS and the voltage at the gate node DRG of the driving TFT DT change together, and as a result, the gate-source voltage Vgs can be maintained. Accordingly, it can be ascertained that the luminance will be maintained even if the first high voltage EVDD changes.

Figure 13:
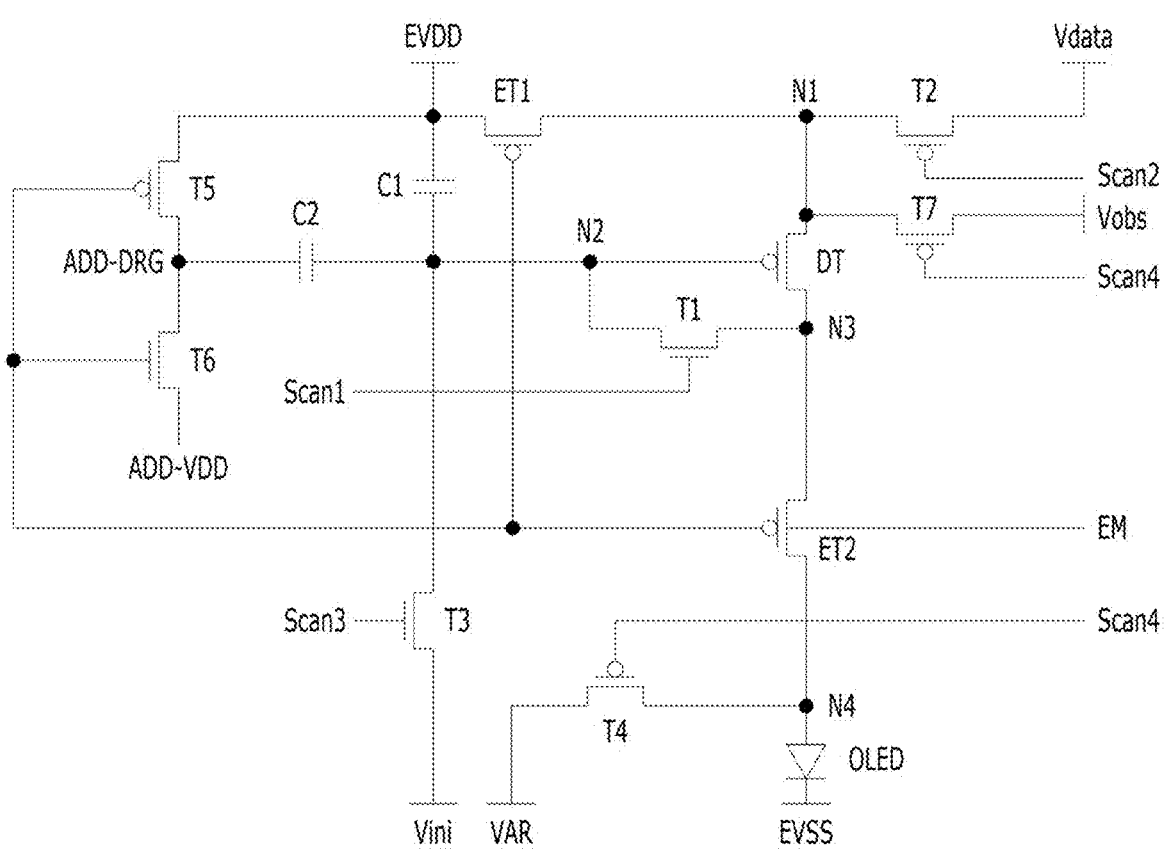
FIG. 13 is a circuit diagram of an example subpixel according to a second aspect of the present disclosure.
Figure 14:
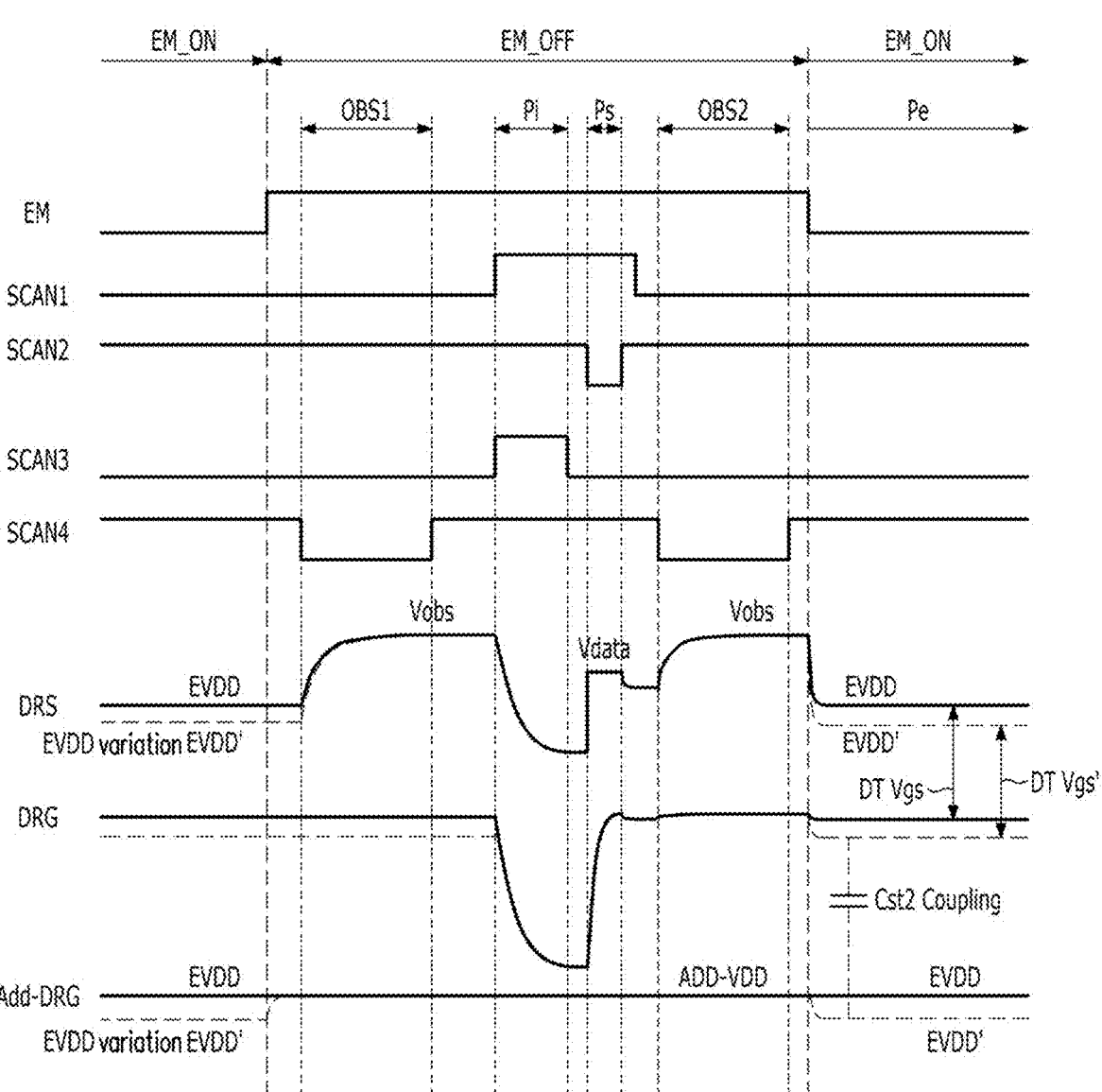
FIG. 14 is a driving waveform diagram of the example subpixel of FIG. 13.

FIG. 13 is a circuit diagram of an example subpixel according to a second aspect of the present disclosure, and FIG. 14 is a driving waveform diagram of the example subpixel of FIG. 13. The subpixel according to the second aspect of the present disclosure differs from the subpixel according to the first aspect in that the former includes a configuration for supplying an on-bias stress (OBS) voltage Vobs to the source node of the driving TFT DT.

As shown in FIGS. 13 and 14, one subpixel SP may be provided with the first high voltage EVDD, the low voltage EVSS, the initialization voltage Vini, the anode reset voltage VAR, the OBS voltage Vobs, and the second high voltage Add-VDD, and may receive the first to fourth scan signals Scan1 to Scan4 (or SCAN1 to SCAN4), the emission signals EM, and the data voltage signal Vdata. The second high voltage Add-VDD may be independent of the first high voltage EVDD despite having the same voltage level as the first high voltage EVDD. Accordingly, the second high voltage Add-VDD may not be affected by variation in the first high voltage EVDD.

One subpixel SP may include an OLED, a driving TFT DT, a first capacitor C1, a second capacitor C2, a first emission control TFT ET1, a second emission control TFT ET2, and first to seventh switching TFTs T1 to T7. Each TFT of the subpixel SP may be configured as a p-type MOSFET (PMOS) or an n-type MOSFET (NMOS). For example, the driving TFT DT, the first emission control TFT ET1, the second emission control TFT ET2, the first switching TFT T1, the fourth switching TFT T4, the fifth switching TFT T5, and the seventh switching TFT T7 may be implemented as p-type MOSFETs, and the second switching TFT T2, the third switching TFT T3, and the sixth switching TFT T6 may be implemented as n-type MOSFETs, without being limited thereto.

The subpixel according to the second aspect of the present disclosure shown in FIG. 13 differs from the subpixel according to the first aspect shown in FIG. 6 with respect to the circuit configuration of the area of the first node N1 connected to the source electrode of the driving TFT DT.

The subpixel according to the second aspect of the present disclosure may further include the seventh switching TFT T7 for supplying the OBS voltage Vobs to the first node N1 connected to the source electrode of the driving TFT DT.

The seventh switching TFT T7 may apply the OBS voltage Vobs to the first node N1 connected to the source electrode of the driving TFT DT upon reception of the fourth scan signal Scan4 along with the fourth switching TFT T4 that applies the anode reset voltage VAR to the anode of the OLED.

The seventh switching TFT T7 may include a gate electrode connected to the input line through which the fourth scan signal SCAN4 is applied, a first electrode to which the OBS voltage Vobs is applied, and a second electrode connected to the first node N1. The seventh switching TFT T7 may be a p-type MOSFET (PMOS) and may be implemented as a low-temperature polycrystalline silicon (LTPS) thin film transistor. Accordingly, the seventh switching TFT T7 may apply the OBS voltage Vobs to the first electrode of the driving TFT DT in response to the low-level third scan signal Scan3, which is the turn-on voltage.

Except the seventh switching TFT T7, the first emission control TFT ET1, the second emission control TFT ET2, and the first to sixth switching TFTs T1 to T6 operate in the same manner as those in the subpixel according to the first aspect.

As shown in FIGS. 13 and 14, the driving period of the example subpixel according to the second aspect of the present disclosure includes an emission period EM_ON in which the emission signal EM is applied at the on level and a non-emission period EM_OFF in which the emission signal EM is applied at the off level. The non-emission period EM_OFF may include an initial period Pi, a sampling period Ps, and a plurality of OBS periods.

When the non-emission period EM_OFF begins, a first OBS operation OBS1 may be performed. During the first OBS operation OBS1, the fourth scan signal Scan4 is applied at a low level, which is the turn-on voltage. In response to the fourth scan signal Scan4 at the turn-on level, the seventh switching TFT T7 that applies the OBS voltage Vobs to the first node N1 of the driving TFT DT and the fourth switching TFT T4 that applies the anode reset voltage VAR to the fourth N4 corresponding to the anode of the OLED are turned on. When the fourth switching TFT T4 is turned on, the anode of the OLED is reset by the anode reset voltage VAR, and thus the emission characteristics of the OLED can be maintained. When the seventh switching TFT T7 is turned on, the OBS voltage Vobs is applied to the driving TFT DT, and thus the hysteresis phenomenon of the driving TFT DT can be alleviated.

During the initial period Pi and the sampling period Ps, the first scan signal Scan1 is applied at a high level, which is the turn-on voltage. The first switching TFT T1 connects the second node N2 and the third node N3 during the initial period Pi and the sampling period Ps in response to the high-level first scan signal Scan1, which is the turn-on voltage. Accordingly, the driving TFT DT enters a diode connecting state in which the gate electrode and the drain electrode are short-circuited and thus operates as a diode.

During the initial period Pi, the third scan signal Scan3 is applied at a high level, which is the turn-on voltage. The third switching TFT T3 is turned on by the turn-on voltage of the third scan signal Scan3 to apply the initialization voltage *Vini* to the second node N2. Since the second node N2 and the third node N3 are connected to each other, the second node N2 corresponding to the gate electrode of the driving TFT DT and the third node N3 corresponding to the drain electrode are initialized to the initialization voltage *Vini*. The initialization voltage *Vini* may be selected within a voltage range sufficiently lower than the operating voltage of the OLED and may be set to a voltage equal to or lower than the low voltage EVSS.

During the sampling period Ps, the second scan signal Scan2 is applied at a low level, which is the turn-on voltage. The second switching TFT T2 applies the data voltage signal Vdata supplied from the data line to the first node N1 corresponding to the first electrode of the driving TFT DT in response to the low-level second scan signal Scan2, which is the turn-on voltage. In the sampling period Ps, the driving TFT DT is turned on and thus a current Ids flows between the source and the drain. Since the gate electrode and the drain electrode of the driving TFT DT are diode-connected, the voltage at the second node N2 rises until the gate-source voltage Vgs of the driving TFT DT reaches the threshold voltage Vth due to the current flowing from the source electrode to the drain electrode. During the sampling period Ps, the second node N2 is charged to a voltage Vdata−|Vth| corresponding to the difference between the data voltage Vdata and the threshold voltage Vth of the driving TFT DT. In this manner, the voltage at the second node N2 may be determined by the data voltage Vdata and the threshold voltage Vth of the driving TFT DT regardless of the high voltage EVDD during the sampling period Ps.

Thereafter, a second OBS operation OBS2 may be performed. During the second OBS operation OBS2, the fourth scan signal Scan4 is applied at a low level, which is the turn-on voltage, and thus the seventh switching TFT T7 that applies the OBS voltage Vobs to the first node N1 of the driving TFT DT and the fourth switching TFT T4 that applies the anode reset voltage VAR to the fourth node N4 corresponding to the anode of the OLED are turned on. Accordingly, the anode of the OLED is reset by the anode reset voltage VAR, and thus the emission characteristics of the OLED can be maintained. When the seventh switching TFT T7 is turned on, the OBS voltage Vobs is applied to the driving TFT DT, and thus the hysteresis phenomenon of the driving TFT DT can be alleviated.

As described above, during the non-emission period (EM_OFF period) in which the data voltage Vdata is sampled, the sixth switching TFT T6 is turned on and the fifth switching TFT T5 is turned off. Accordingly, the second high voltage ADD-VDD is applied to the second capacitor C2 and thus the additional gate electrode node ADD-DRG can be maintained at the second high voltage ADD-VDD.

When the emission signal EM is applied at a low level, which is the turn-on voltage (EM_ON), during the emission period Pe, the first emission control TFT ET1 and the second emission control TFT ET2 are turned on. The high voltage EVDD is applied to the first node N1 as the first emission control TFT ET1 is turned on, and a current path is formed between the third node N3 and the fourth node N4 as the second emission control TFT ET2 is turned on. Accordingly, the driving current Ioled generated through the source and drain electrodes of the driving TFT DT may be applied to the OLED to emit light. In this manner, during the emission period Pe, the high voltage EVDD may be applied to the first node N1 corresponding to the source electrode of the driving TFT DT, and thus the OLED emits light according to the data voltage Vdata programmed during the sampling period Ps.

Here, during the emission period (EM_ON period), the sixth switching TFT T6 is turned off and the fifth switching TFT T5 is turned on. Accordingly, the first high voltage EVDD is applied to the second capacitor C2, and thus the additional gate electrode node ADD-DRG can be maintained at the first high voltage EVDD. The second high voltage ADD-VDD is an independent voltage and is not affected by the first high voltage EVDD. Therefore, when the first high voltage EVDD changes during the emission period after the sampling period, the changed first high voltage is transmitted to the second node N2 according to capacitance coupling between the second capacitor C2 and the second node N2.

Accordingly, as shown in FIG. 14 illustrating changes in the voltages of the node N1 (source node DRS of the driving TFT DT) and the node N2 (gate node DRG of the driving TFT DT), the voltage at the second node N2 (gate node DRG of the driving TFT DT) may change as the voltage at the first node N1 (source node DRS of the driving TFT DT) changes due to variation in the high voltage EVDD. As a result, variation in the gate-source voltage Vgs can be reduced.

Figure 15:
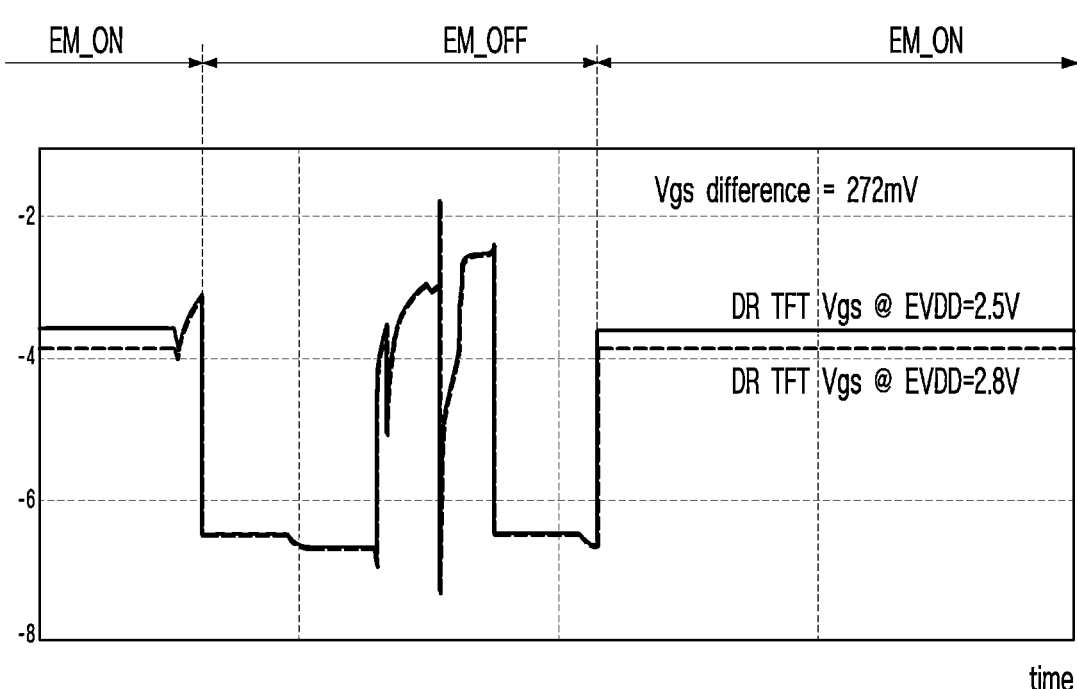
FIGS. 15 and 16 are graphs showing results of simulating variations in gate-source voltages Vgs of subpixels according to the comparative example and the second aspect.
Figure 16:
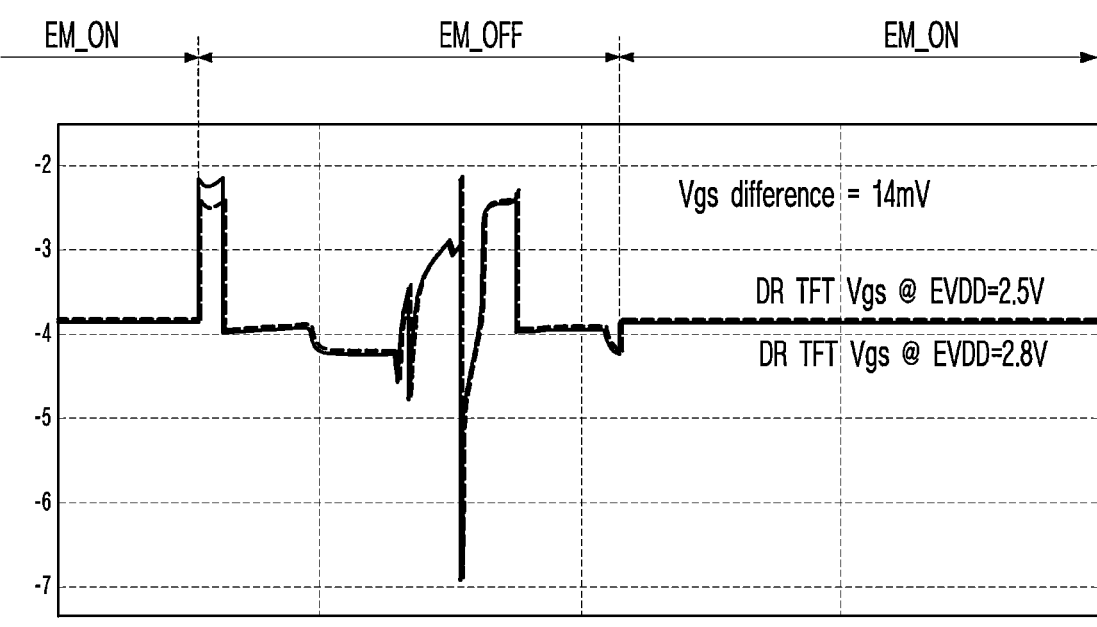

FIGS. 15 and 16 are graphs showing results of simulating variations in the gate-source voltage Vgs in the comparative example in which the conventional subpixel structure is applied and in an aspect in which the subpixel structure of the second aspect of the present disclosure is applied under the same conditions in which the first high voltage EVDD varies. FIG. 15 is a simulation graph of the comparative example and FIG. 16 is a simulation graph of the second aspect.

From the simulation graph of the comparative example shown in FIG. 15, it can be ascertained that the voltages at the source node DRS and the gate node DRG of the driving TFT DT do not change during the non-emission period EM_OFF even if the first high voltage EVDD changes from 2.8 V to 2.5 V.

It can be ascertained that the voltage at the source node DRS changes according to variation in the first high voltage EVDD, whereas the voltage at the gate node DRG is not affected by the variation in the first high voltage EVDD during the emission period EM_ON. Accordingly, it is confirmed that a difference in the gate-source voltage Vgs of 272 mV occurs when the first high voltage EVDD changes from 2.8 V to 2.5 V in the emission period EM_ON.

From the simulation graph of the aspect shown in FIG. 16, it can be ascertained that the voltages at the source node DRS and the gate node DRG of the driving TFT DT do not change in the non-emission period EM_OFF even if the high voltage EVDD changes from 2.8 V to 2.5 V.

It can be ascertained that the voltage at the source node DRS changes according to variation in the first high voltage EVDD and the voltage at the gate node DRG also changes according to the variation in the first high voltage EVDD in the emission period EM_ON. That is, it is confirmed that the voltages at the source node DRS and the gate node DRG of the driving TFT DT change together as the first high voltage EVDD varies. As a result, it is confirmed that a difference in the gate-source voltage Vgs of 14 mV occurs when the first high voltage EVDD changes from 2.8 V to 2.5 V in the emission period EM_ON.

As described above, under the same conditions in which the first high voltage EVDD changes from 2.8 V to 2.5 V, a difference in the gate-source voltage Vgs of 272 mV in the emission period EM_ON is 272 mV in the comparative example shown in FIG. 15, whereas a difference in the gate-source voltage Vgs is merely 14 mV in the case of the aspect. Accordingly, it can be confirmed that the difference in the gate-source voltage Vgs can be significantly reduced compared to the comparative example.

Aspects of the present disclosure have the following effects.

The aspects of the present disclosure can provide a display device that can improve the accuracy and stability of the operation of driving transistors of subpixels.

The aspects of the present disclosure can provide a display device that can minimize changes in the luminance of the display device by minimizing changes in the gate-source voltage Vgs of the driving transistor even when a high voltage EVDD changes due to various causes such as IR drop.

The effects according to the present disclosure not limited to the aforementioned effects, and various other effects are within the scope of the present disclosure.

Although aspects of the present disclosure have been described in more detail with reference to the accompanying drawings, the present disclosure is not necessarily limited to these aspects, and various modifications may be made without departing from the technical spirit of the present disclosure. Accordingly, the aspects disclosed in the present disclosure are not intended to limit the technical idea of the present disclosure, but rather to explain the technical idea, and the scope of the technical idea of the present disclosure is not limited by these aspects. Therefore, the aspects described above should be understood in all respects as illustrative and not restrictive. The protective scope of the present disclosure should be interpreted in accordance with the claims and their equivalents, and all technical ideas within the equivalent scope should be interpreted as being within the scope of the present disclosure.

What is claimed is:

1. A display device, comprising:

a light emitting element;

a first high voltage source configured to supply a first high voltage;

a second high voltage source configured to supply a second high voltage at the same level as the first high voltage;

a driving TFT including a first electrode, a second electrode connected to the light emitting element, and a gate electrode connected to a first gate node;

a first capacitor connected between the first high voltage source and the first gate node; and a second capacitor connected between the first gate node and a second gate node, wherein a voltage level of the gate electrode is determined according to a data voltage input to the first electrode in a state in which the gate electrode and the second electrode are connected in a non-emission period, wherein the driving TFT is configured to receive the first high voltage through the first electrode to control a current applied to the light emitting element according to a voltage difference between the gate electrode and the first electrode in a state in which the gate electrode is disconnected from the second electrode in an emission period, and wherein the second high voltage is applied to the second gate node in the non-emission period, and the first high voltage is applied to the second gate node in the emission period.

2. The display device of claim 1, further comprising:

a first emission control TFT configured to be turned on during the emission period to connect the first electrode and the first high voltage source; and a second emission control TFT configured to be turned on during the emission period to connect the second electrode and the light emitting element.

3. The display device of claim 1, further comprising:

a first switching TFT configured to be turned on during the emission period to connect the gate electrode and the second electrode;

a second switching TFT configured to be turned on during the non-emission period to connect an input line through which the data voltage is supplied to the first electrode;

a third switching TFT configured to be turned on during the non-emission period to apply an initialization voltage to the first gate node; and a fourth switching TFT configured to apply a reset voltage to a current input terminal of the light emitting element.

4. The display device of claim 3, wherein at least one of the first to fourth switching TFT is a different type from the driving TFT.

5. The display device of claim 3, further comprising:

a fifth switching TFT configured to connect the second gate node and the first high voltage source during the emission period; and a sixth switching TFT configured to connect the second gate node and the second high voltage source during the non-emission period.

6. The display device of claim 5, wherein the second capacitor connected to the second high voltage source and the first capacitor connected to the first high voltage source are connected in series during the non-emission period, and the second capacitor connected to the first high voltage source and the first capacitor connected to the first high voltage source are connected in parallel during the emission period.

7. The display device of claim 5, wherein the sixth switching TFT is a different type from the fifth switching TFT.

8. The display device of claim 7, further comprising:

a signal line applying an emission signal, wherein a gate electrode of the fifth switching TFT and a gate electrode of the sixth switching TFT is connected to the signal line.

9. The display device of claim 5, further includes a seventh switching TFT configured to be turned on during the non-emission period to apply an on-bias stress (OBS) voltage to the first electrode.

10. A display device, comprising:

a light emitting element;

a first high voltage source configured to supply a first high voltage;

a second high voltage source configured to supply a second high voltage;

a driving TFT including a first electrode connected to a first node, a second electrode connected to a third node, and a gate electrode connected to a second node;

a first emission control TFT configured to be turned on by an on-level emission signal to connect the first high voltage source and the first node;

a second emission control TFT configured to be turned on by the on-level emission signal to connect the third node and the light emitting element;

a first switching TFT configured to be turned on by an on-level first scan signal to connect the gate electrode and the second electrode;

a second switching TFT configured to be turned on by an on-level second scan signal to connect an input line through which a data voltage is supplied to the first node;

a fifth switching TFT configured to be turned on by the on-level emission signal to connect the first high voltage source and the second node;

a sixth switching TFT configured to be turned on by an off-level emission signal to connect the second high voltage source and the second node; and a second capacitor having a first electrode connected to the second node and a second electrode connected to the fifth or sixth switching TFT.

11. The display device of claim 10, further comprising a first capacitor having a first electrode connected to the second node and a second electrode connected to the first high voltage source.

12. The display device of claim 10, further comprising:

a third switching TFT configured to be turned on by an on-level third scan signal to apply an initialization voltage to the second node; and a fourth switching TFT configured to be turned on by an on-level fourth scan signal to apply a reset voltage to a current input terminal of the light emitting element.

13. The display device of claim 12, further comprising a seventh switching TFT configured to be turned on by the on-level fourth scan signal to apply an on-bias stress (OBS) voltage to the first electrode.

14. A display device, comprising:

a light emitting element;

a first high voltage source configured to supply a first high voltage;

a driving TFT including a first electrode, a second electrode connected to the light emitting element, and a gate electrode, wherein a voltage level of the gate electrode is determined according to a data voltage input to the first electrode in a state in which the gate electrode and the second electrode are connected in a non-emission period, the driving TFT being configured to receive the first high voltage through the first electrode to control a current applied to the light emitting element according to a voltage difference between the gate electrode and the first electrode in a state in which the gate electrode is disconnected from the second electrode in an emission period; and a voltage compensation circuit including:

a second high voltage source configured to supply a second high voltage at the same level as the first high voltage;

a second capacitor connected to the gate electrode;

a fifth switching TFT configured to connect the second capacitor and the first high voltage source during the emission period; and a sixth switching TFT configured to connect the second capacitor and the second high voltage source during the non-emission period.

15. The display device of claim 14, further comprising:

a first emission control TFT configured to be turned on during the emission period to connect the first electrode and the first high voltage source; and a second emission control TFT configured to be turned on during the emission period to connect the second electrode and the light emitting element.

16. The display device of claim 14, further comprising:

a first switching TFT configured to be turned on during the emission period to connect the gate electrode and the second electrode;

a second switching TFT configured to be turned on during the non-emission period to connect an input line through which the data voltage is supplied to the first electrode;

a third switching TFT configured to be turned on during the non-emission period to apply an initialization voltage to the gate electrode;

a fourth switching TFT configured to apply a reset voltage to a current input terminal of the light emitting element; and a first capacitor connected between the first high voltage source and the gate electrode.

17. The display device of claim 14, further comprising a first capacitor connected between the first high voltage source and the gate electrode, wherein the second capacitor connected to the second high voltage source and the first capacitor connected to the first high voltage source are connected in parallel during the non-emission period, and the second capacitor connected to the first high voltage source and the first capacitor connected to the first high voltage source are connected in parallel during the emission period.

18. The display device of claim 14, wherein the second capacitor is configured to reflect, in the gate electrode, a difference between the voltage of the second high voltage source connected to the second capacitor during the non-emission period and the voltage of the first high voltage source connected to the second capacitor during the emission period.

19. The display device of claim 14, further comprising:

a first emission control TFT configured to be turned on during the emission period to connect the first electrode and the first high voltage source, and a second emission control TFT configured to be turned on during the emission period to connect the second electrode and the light emitting element, wherein the fifth switching TFT is configured to connect the second capacitor and the first high voltage source by receiving an on-level emission signal input to the first emission control TFT and the second emission control TFT, and wherein the sixth switching TFT is configured to connect the second capacitor and the second high voltage source by receiving an off-level emission signal input to the first emission control TFT and the second emission control TFT.

20. The display device of claim 14, further includes a seventh switching TFT configured to be turned on during the non-emission period to apply an on-bias stress (OBS) voltage to the first electrode.

\* \* \* \* \*